United States Patent
Jung et al.

(10) Patent No.: US 7,876,415 B2
(45) Date of Patent: Jan. 25, 2011

(54) DISPLAY SUBSTRATE HAVING A TFT LIQUID CRYSTAL DISPLAY REGION SURROUNDED BY A SEAL REGION HAVING A CELL-GAP COMPENSATING PART WITH A DUMMY PATTERN FORMED FROM THE SAME LAYER AS A PIXEL ELECTRODE OF THE TFT

(75) Inventors: Min-Sik Jung, Seoul (KR); Bong-Kyu Shin, Bucheon-si (KR); Joo-Han Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 12/045,283

(22) Filed: Mar. 10, 2008

(65) Prior Publication Data

US 2008/0239188 A1 Oct. 2, 2008

(30) Foreign Application Priority Data

Mar. 28, 2007 (KR) ...................... 10-2007-0030562

(51) Int. Cl.
  *G02F 1/1339* (2006.01)

(52) U.S. Cl. ...................................... 349/153; 349/155
(58) Field of Classification Search ......... 349/153–157, 349/190
  See application file for complete search history.

(56) References Cited

U.S. PATENT DOCUMENTS 7,173,684 B2 * 2/2007 Yoo et al. .................... 349/155

\* cited by examiner

*Primary Examiner*—John Heyman
(74) *Attorney, Agent, or Firm*—H.C. Park & Associates, PLC

(57) ABSTRACT

A display substrate includes a base substrate, a thin-film transistor (TFT), a pixel electrode, a pad part, and a cell-gap compensating part. The base substrate has a display region, a seal region surrounding the display region, and a peripheral region surrounding the seal region. The TFT is in the display region. The pixel electrode is connected to a drain electrode of the TFT and contacts the base substrate. The pad part is interposed between a first side of the base substrate and the seal region and is connected to the TFT through a first transmission line. The cell-gap compensating part is in the seal region and includes a compensating pattern adjacent to a second side of the base substrate and an insulating pattern on the compensating pattern.

17 Claims, 23 Drawing Sheets

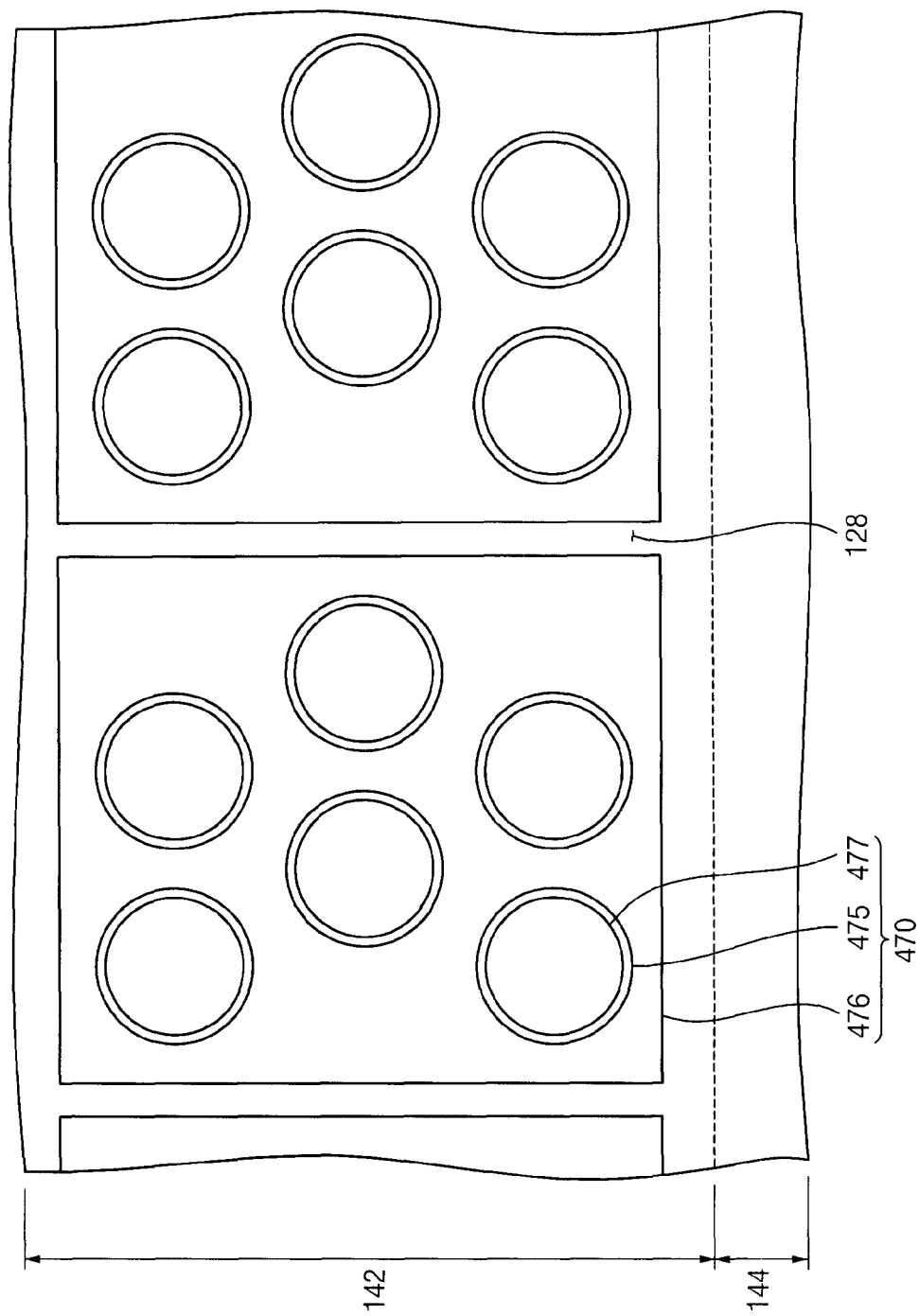

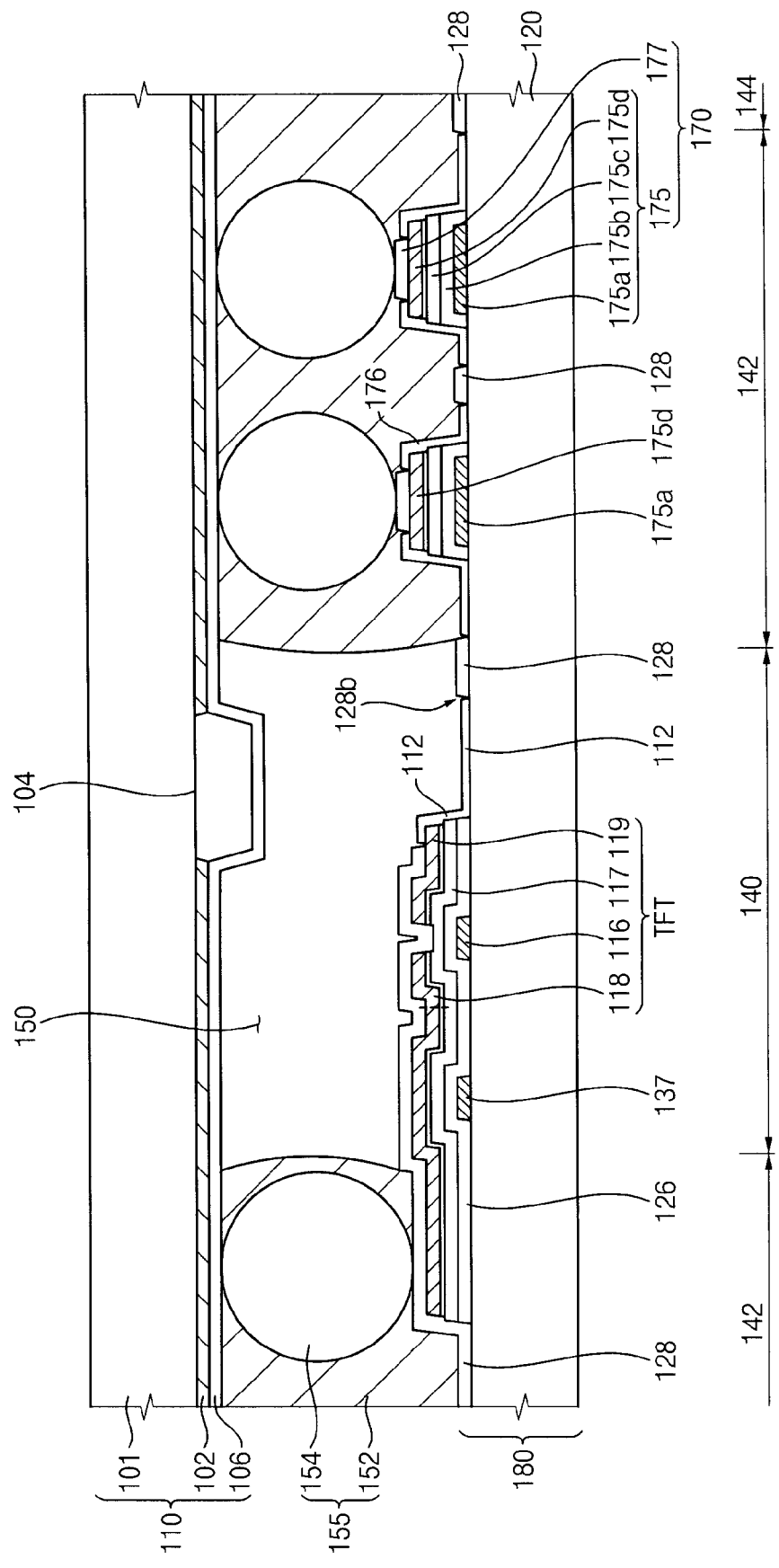

DISPLAY SUBSTRATE HAVING A TFT LIQUID CRYSTAL DISPLAY REGION SURROUNDED BY A SEAL REGION HAVING A CELL-GAP COMPENSATING PART WITH A DUMMY PATTERN FORMED FROM THE SAME LAYER AS A PIXEL ELECTRODE OF THE TFT

CROSS-REFERENCE TO RELATED APPLICATIONS

The present application claims priority from and the benefit of Korean Patent Application No. 10-2007-0030562, filed on Mar. 28, 2007, which is hereby incorporated by reference for all purposes as if fully set forth herein.

BACKGROUND OF THE INVENTION

1. Field of the Invention

The present invention relates to a display substrate, a liquid crystal display (LCD) device including the display substrate, and a method of manufacturing the display substrate. More particularly, the present invention relates to a display substrate for a display device, an LCD device including the display substrate that may have improved image display quality, and a method of manufacturing the display substrate.

2. Discussion of the Background

A liquid crystal display (LCD) device displays an image using the electrical and optical characteristics of liquid crystals. LCD devices are generally thin, light weight, and small, which allows them to be used in various fields.

An LCD device includes a display substrate, an opposite substrate facing the display substrate, and a liquid crystal layer interposed between the display substrate and the opposite substrate. The arrangement of the liquid crystals of the liquid crystal layer varies in response to an electric field applied between a pixel electrode of the display substrate and a common electrode of the opposite substrate. This changes the light transmittance of the liquid crystal layer, thereby displaying the image.

In order to decrease the cost of manufacturing an LCD device, fewer masks may be used to manufacture a display substrate may be decreased. However, if too few masks are used to manufacture the display substrate, the surface uniformity of the display substrate may deteriorate, which may cause the thickness of the liquid crystal layer to be less uniform.

When the thickness uniformity of the liquid crystal layer decreases, optical characteristics of the liquid crystal layer may change, which may deteriorate the image display quality of the LCD device.

SUMMARY OF THE INVENTION

The present invention provides a display substrate for a display device.

The present invention also provides an LCD device including the above-mentioned display substrate, which may be capable of improving image display quality.

The present invention also provides a method of manufacturing the above-mentioned display substrate.

Additional features of the invention will be set forth in the description which follows, and in part will be apparent from the description or may be learned by practice of the invention.

The present invention discloses a display substrate including a base substrate, a thin-film transistor (TFT), a pixel electrode, a pad part, and a cell-gap compensating part. The base substrate has a display region, a seal region surrounding the display region, and a peripheral region surrounding the seal region. The TFT is in the display region. The pixel electrode is connected to a drain electrode of the TFT and contacts the base substrate. The pad part is interposed between a first side of the base substrate and the seal region and is connected to the TFT through a first transmission line. The cell-gap compensating part is in the seal region and includes a compensating pattern adjacent to a second side of the base substrate and an insulating pattern on the compensating pattern.

The present invention also discloses an LCD device including a display substrate, an opposite substrate, a liquid crystal layer, and a sealing member. The display substrate includes a base substrate, a TFT, a pixel electrode, a pad part, and a cell-gap compensating part. The base substrate has a display region, a seal region surrounding the display region, and a peripheral region surrounding the seal region. The TFT is in the display region. The pixel electrode is connected to a drain electrode of the TFT and contacts the base substrate. The pad part is interposed between a first side of the base substrate and the seal region and is connected to the TFT through a transmission line. The cell-gap compensating part is in the seal region and includes a compensating pattern adjacent to a second side of the base substrate and an insulating pattern on the compensating pattern. The opposite substrate faces the display substrate. The liquid crystal layer is interposed between the display region of the display substrate and the opposite substrate. The sealing member is interposed between the seal region of the display substrate and the opposite substrate and includes a sealant and a seal spacer. The sealant seals the liquid crystal layer. The seal spacer is disposed in the sealant to maintain a distance between the display substrate and the opposite substrate.

The present invention also discloses a method of manufacturing a display substrate forming a TFT, a pad part, and a compensating pattern on a base substrate. A preliminary passivation layer, which covers the TFT, the pad part, and the compensating pattern, is formed on the base substrate. The preliminary passivation layer is etched to form a passivation layer that covers the TFT, a cover pattern that covers a side surface of a drain electrode of the TFT, and an insulating pattern disposed on the compensating pattern. The cover pattern is etched to expose a side surface of the drain electrode. A pixel electrode connected to the drain electrode through the side surface is formed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 22 is a plan view showing a display substrate in accordance with a fourth exemplary embodiment of the present invention.

FIG. 23 is a cross-sectional view showing an LCD device in accordance with a fifth exemplary embodiment of the present invention.

DETAILED DESCRIPTION OF THE ILLUSTRATED EMBODIMENTS

Figure 1:
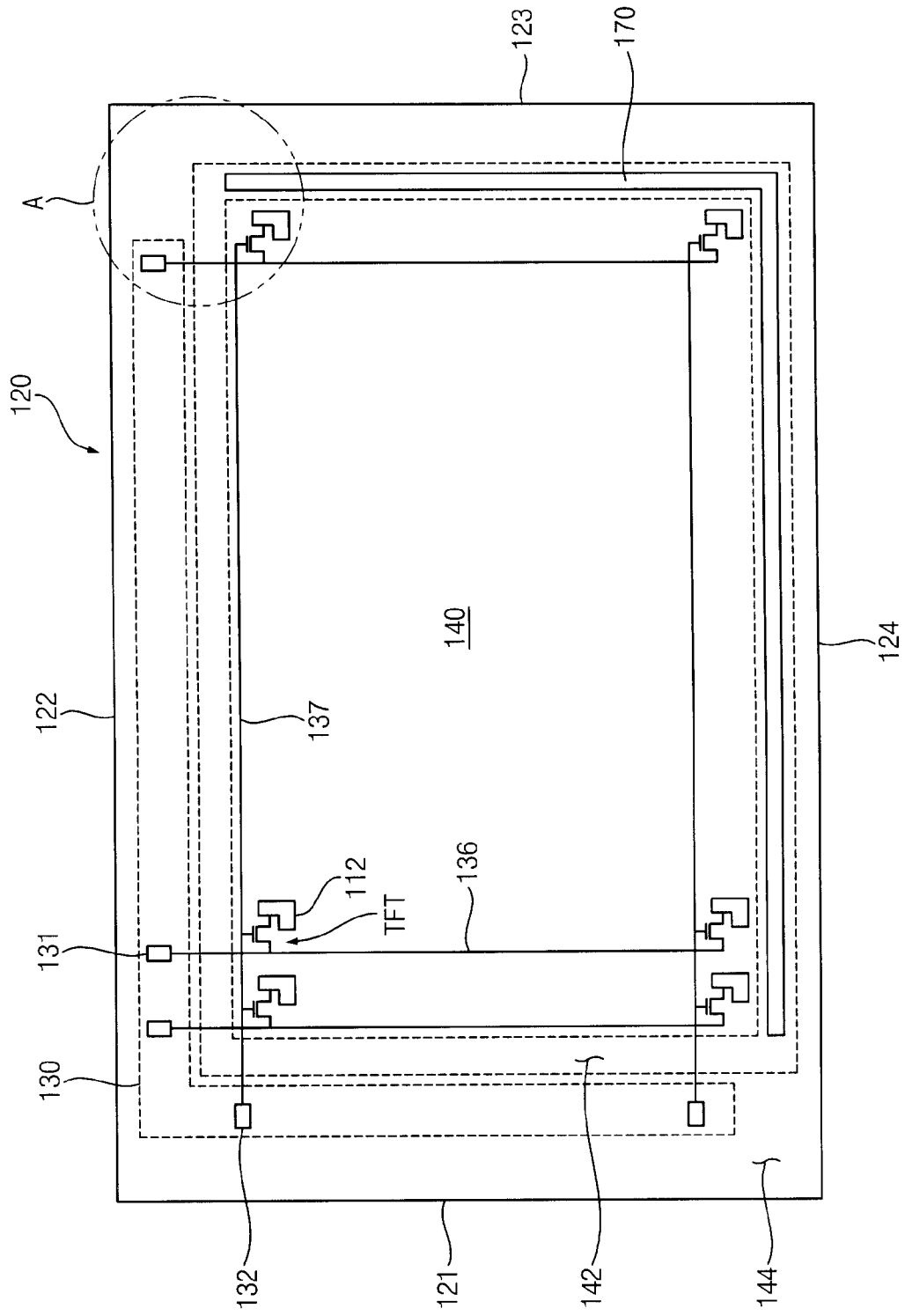
FIG. 1 is a plan view showing a display substrate in accordance with a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a plan view showing a display substrate in accordance with a first exemplary embodiment of the present invention.

Referring to FIG. 1, the display substrate includes a base substrate 120, a thin film transistor TFT, a gate line 137, a pad part 130, a data line 136, a pixel electrode 112, and a cell-gap compensating part 170.

A pixel region 140, a seal region 142, and a peripheral region 144 may be defined on the base substrate 120. An image may be displayed in the pixel region 140. The seal region may 142 surround the pixel region 140 and the peripheral region 144 may surround the seal region 142. In FIG. 1, the base substrate 120 includes a first side 121, a second side 122 adjacent to the first side 121, a third side 123 facing the first side 121, and a fourth side 124 facing the second side 122. For example, the first, second, third, and fourth sides 121, 122, 123, and 124 may form a substantially rectangular shape.

The base substrate 120 may include a transparent material that transmits light. For example, the base substrate 120 may include triacetyl cellulose (TAC), polycarbonate (PC), polyethersulfone (PES), polyethylene terephthalate (PET), polyethylene naphthalate (PEN), polyvinyl alcohol (PVA), polymethyl methacrylate (PMMA), and cyclo-olefin polymer (COP). These materials may be used alone or in a combination thereof The gate line 137 may be formed on the base substrate 120 and may extend in a direction substantially parallel to the second side 122. In FIG. 1, the gate line 137 may extend from the display region 140 toward the first side 121 through a left portion of the seal region 142.

The data line 136 is formed on the base substrate 120 and extends in a direction substantially parallel to the first side 121. In FIG. 1, the data line 136 extends from the display region 140 toward the second side 122 through an upper portion of the seal region 142.

The pad part 130 may include a gate pad 132 and a data pad 131.

The gate pad 132 may be interposed between the first side 121 and the seal region 142 and is connected to the gate line 137.

The data pad 131 may be interposed between the second side 122 and the seal region 142 and is connected to the data line 136.

The thin film transistor TFT may be formed in the pixel region 140 and is connected to the data line 136 and the gate line 137. For example, a plurality of thin film transistors TFT may be arranged in a matrix in the pixel region 140.

The cell-gap compensating part 170 may be formed in the seal region 142 adjacent to the sides of the base substrate 120 that face the pad part 130. The cell-gap compensating part 170 may make the thickness of the display substrate more uniform in the seal region 142. In FIG. 1, the cell-gap compensating part 170 may be formed in the seal region 142 adjacent to the third and fourth sides 123 and 124 of the base substrate 120.

Figure 2:
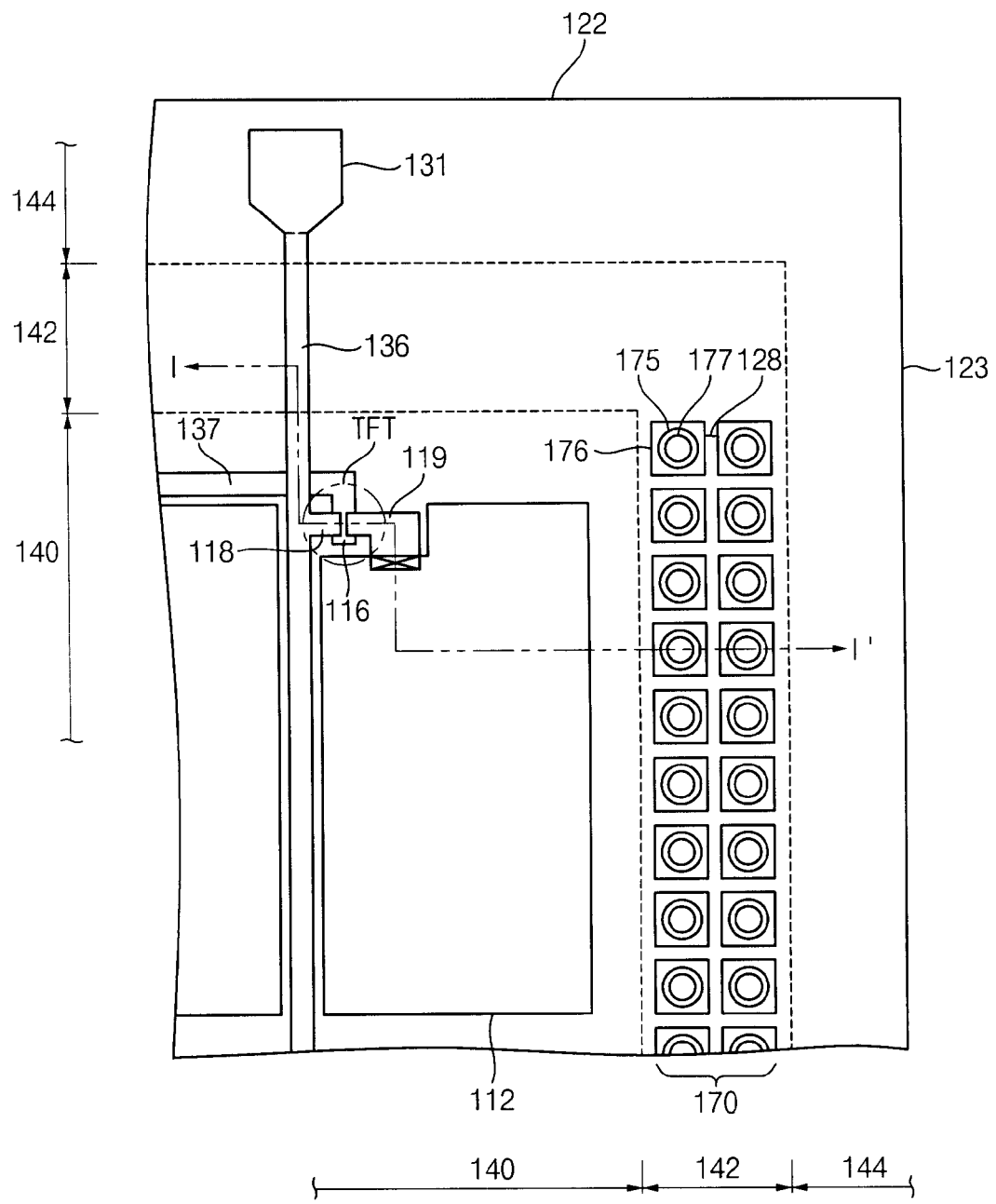
FIG. 2 is an enlarged plan view showing portion 'A' shown in FIG. 1.
Figure 3:
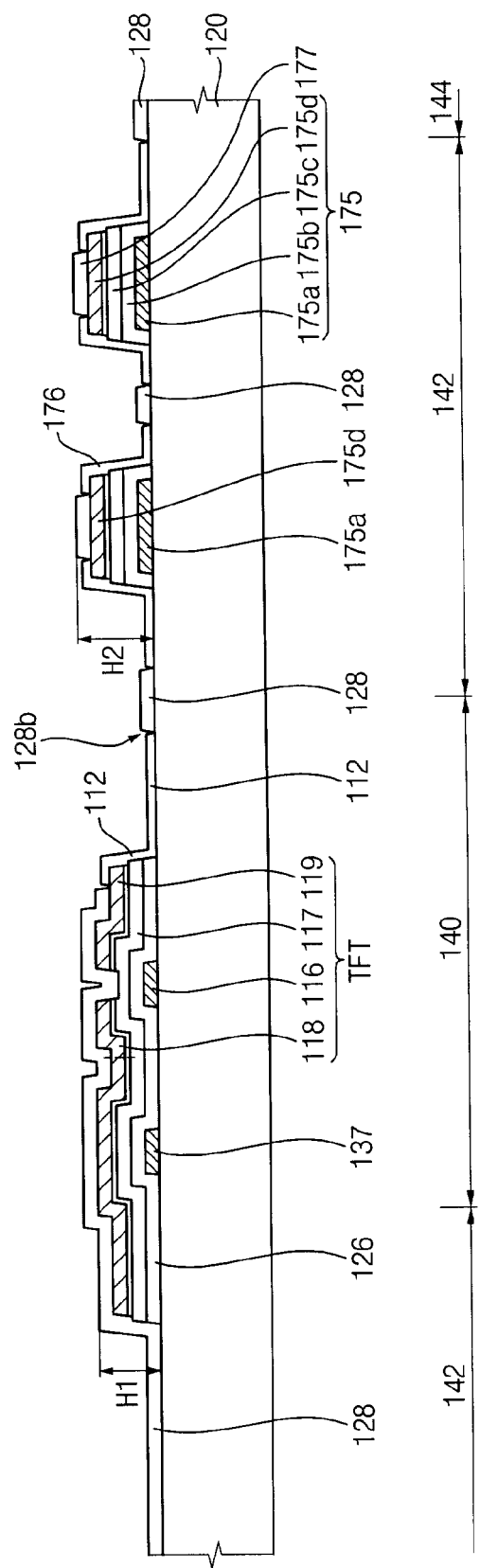
FIG. 3 is a cross-sectional view taken along line I-I' shown in FIG. 2.

FIG. 2 is an enlarged plan view showing portion 'A' shown in FIG. 1. FIG. 3 is a cross-sectional view taken along line I-I' shown in FIG. 2.

Referring to FIG. 1, FIG. 2, and FIG. 3, a gate electrode 116 of the thin film transistor TFT, the gate line 137, and the gate pad 132 are formed on the base substrate 120. The gate line 137 is connected to the gate electrode 116. The gate pad 132 is connected to the gate line 137. Each of the gate electrode 116, the gate line 137, and the gate pad 132 may have a single layered structure or a multi-layered structure. The gate electrode 116, the gate line 137, and the gate pad 132 may include aluminum, molybdenum, copper, or an alloy thereof. These materials may be used alone of a combination thereof. For example, each of the gate electrode 116, the gate line 137, and the gate pad 132 may have a double-layered structure having an aluminum layer and a molybdenum layer on the aluminum layer.

The gate insulating layer 126 may be formed on the base substrate 120 to cover the gate line 137 and the gate electrode 116. The gate insulating layer 126 may include silicon nitride or silicon oxide. These materials may be used alone or in a combination thereof.

The semiconductor layer 117 may be formed on the gate insulating layer 126 and may include an amorphous silicon layer and an N+ amorphous silicon layer on the amorphous silicon layer.

Source and drain electrodes 118 and 119 of the thin film transistor TFT, the data line 136, and the data pad 131 may be formed on the semiconductor layer 117. The drain electrode 119 may be spaced apart from the source electrode 118. The data line 136 is connected to the source electrode 118. The data pad 131 is connected to the data line 136.

A passivation layer 128 may be formed on the base substrate 120 and may cover the source electrode 118, the data line 136, and the gate line 137. The passivation layer 128 may have an opening that partially exposes a side surface of the drain electrode 119 so that the exposed side surface of the drain electrode 119 may contact the pixel electrode 112. The passivation layer 128 may include silicon nitride or silicon oxide. These materials may be used alone of in a combination thereof.

In FIG. 1, FIG. 2, and FIG. 3, the passivation layer 128 may further include a plurality of openings 128b arranged in a matrix in the seal region 142. In addition, the passivation layer 128 may expose the data pad 131 and the gate pad 132.

The pixel electrode 112 is connected to the drain electrode 119, and may include a transparent conductive material. For example, the pixel electrode 112 may include indium tin oxide (ITO) or indium zinc oxide (IZO). These materials may be used alone or in a combination thereof.

The cell-gap compensating part 170 may be formed in the seal region 142 of the base substrate 120 and may include a compensating pattern 175 and an insulating pattern 177 on the compensating pattern 175.

In FIG. 1, FIG. 2, and FIG. 3, the compensating pattern 175 may include a first compensating layer 175a, a second compensating layer 175b, a third compensating layer 175c, and a fourth compensating layer 175d. For example, the compensating pattern 175 may have a height of about 10 µm to about 80 µm.

The first compensating layer 175a may be formed on the base substrate 120, and may be formed from the same layer as the gate electrode 116, the gate line 137, and the gate pad 132. In FIG. 1, FIG. 2, and FIG. 3, the first compensating layer 175a is a conductive pattern.

The second compensating layer 175b may be formed on the first compensating layer 175a and may be formed from the same layer as the gate insulating layer 126. In FIG. 1, FIG. 2, and FIG. 3, the second compensating layer 175b covers an upper surface and a side surface of the first compensating layer 175a to protect the first compensating layer 175a during subsequent processes. Alternatively, the second compensating layer 175b may be formed only on the upper surface of the first compensating layer 175a.

The third compensating layer 175c may be formed on the second compensating layer 175b and may be formed from the same layer as the semiconductor layer 117.

The forth compensating layer 175d may be formed on the third compensating layer 175c and may be formed from the same layer as the source electrode 118, the drain electrode 119, the data line 136, and the data pad 131. In FIG. 1, FIG. 2, and FIG. 3, the fourth compensating layer 175d is a conductive pattern.

The insulating pattern 177 may be formed on the fourth compensating layer 175d and may be formed from the same layer as the passivation layer 128. For example, the insulating pattern 177 may be smaller than the compensating pattern 175 when viewed on a plane.

In FIG. 1, FIG. 2, and FIG. 3, the cell-gap compensating part 170 may further include a dummy pattern 176. The dummy pattern 176 may be formed in each opening 128b of the passivation layer 128, which may be formed in the seal region 142. The dummy pattern 176 may surround the compensating pattern 175 and the insulating pattern 177 and may be formed from the same layer as the pixel electrode 122. In FIG. 1, FIG. 2, and FIG. 3, one compensating pattern 175 and one insulating pattern 177 may be formed in the dummy pattern 176. Alternatively, a plurality of compensating patterns 175 and a plurality of insulating patterns 177 may be formed in the dummy pattern 176.

In FIG. 1, FIG. 2, and FIG. 3, the height H2 of the cell-gap compensating part 170 may be greater than the height H1 of the display substrate in the seal region 142 adjacent to the second side 122 by an amount equal to the height of the first compensating layer 175a. For example, the height of the display substrate in the seal region 142 may be determined with respect to an upper surface of the base substrate 120. In this case, the height H2 of the cell-gap compensating part 170 may be substantially the same as the height of the display substrate in the seal region 142 adjacent to the third side 123. Also, the height of the display substrate in the seal region 142 adjacent to the third side 123 may be substantially the same as the height of the display substrate in the seal region 142 adjacent to the fourth side 124. Alternatively, the height of the display substrate in the seal region 142 adjacent to the third side 123 may be different from the height of the display substrate in the seal region 142 adjacent to the fourth side 124.

For example, the height H2 of the cell-gap compensating part 170 and the height of the first compensating layer 175a may be about 13,000 Å and about 2,000 Å, respectively, and the height H1 of the display substrate in the seal region 142 adjacent to the second side 122 may be about 11,000 Å.

When the display substrate does not include the cell-gap compensating part 170, the difference between the height of the display substrate in the seal region 142 adjacent to the second side 122 and the height of the display substrate in the seal region 142 adjacent to the third side 123 may be about 10,000 Å. However, in FIG. 1, FIG. 2, and FIG. 3, the difference between the height of the display substrate in the seal region 142 adjacent to the second side 122 and the height of the display substrate in the seal region 142 adjacent to the third side 123 may be negligible so that the height of the seal region 142 may be more uniform.

In FIG. 1, FIG. 2, and FIG. 3, the gate pads 132 may be adjacent to the first side 121, and the cell-gap compensating part 170 may have an L-shape adjacent to the third and fourth sides 123 and 124. Alternatively, the gate pads 132 may be alternately arranged in a region adjacent to the first and third sides 121 and 123, and the cell-gap compensating part 170 may have an I-shape adjacent to the fourth side 124.

Figure 4:
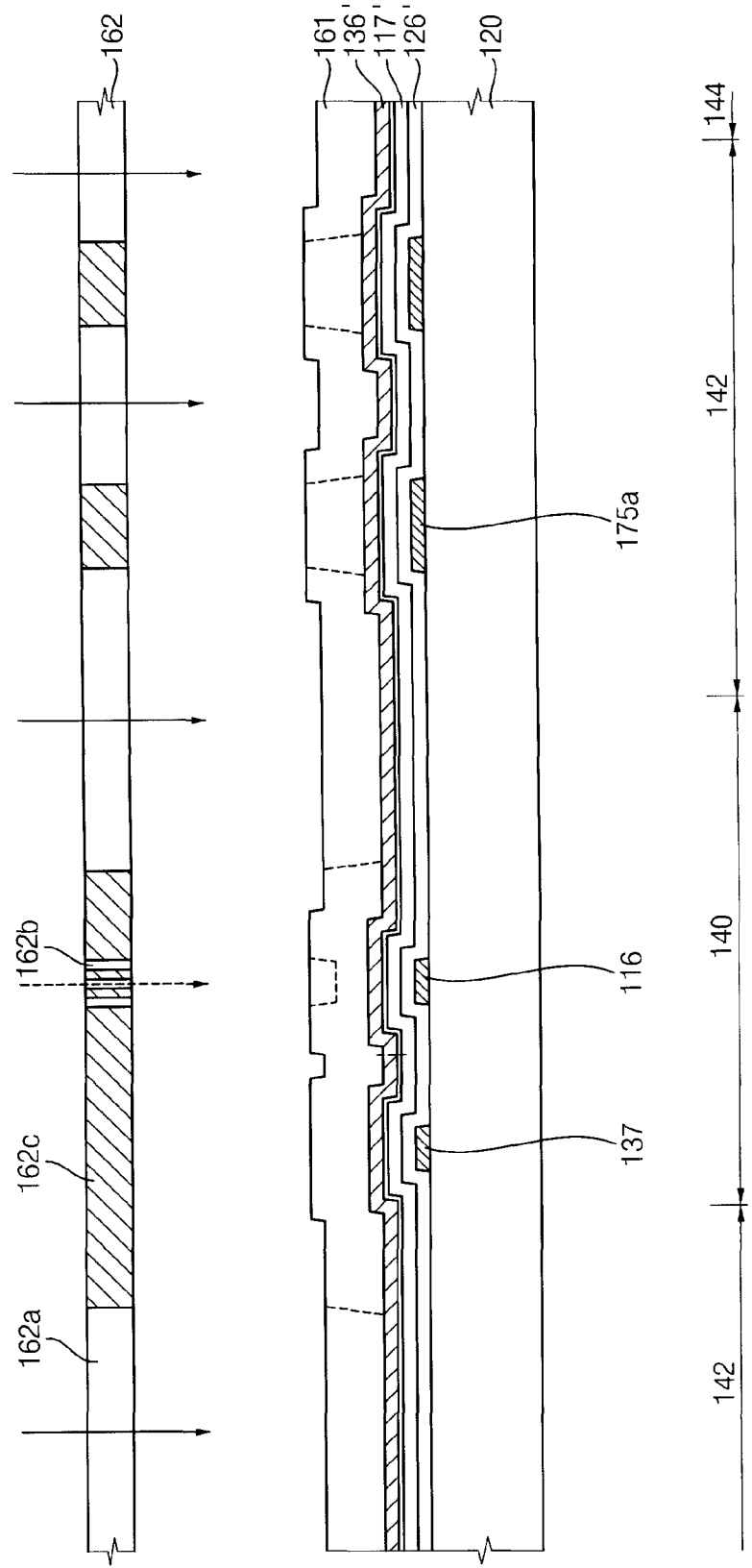
FIG. 4, FIG. 5, FIG. 6, FIG. 7, FIG. 8, FIG. 9, FIG. 10, and FIG. 11 are cross-sectional views showing a method of manufacturing the display substrate shown in FIG. 1.

FIG. 4, FIG. 5, FIG. 6, FIG. 7, FIG. 8, FIG. 9, FIG. 10, and FIG. 11 are cross-sectional views showing a method of manufacturing the display substrate shown in FIG. 1. FIG. 4 is a cross-sectional view showing a step of exposing the first photoresist film.

Referring to FIG. 1, FIG. 2, and FIG. 4, the gate pad 132, the gate line 137, the gate electrode 116, and the first compensating layer 175a may be formed on the base substrate 120. As shown in FIG. 1, FIG. 2, and FIG. 4, a gate metal layer (not shown) deposited on the base substrate 120 may be patterned through a photolithography process to form the gate pad 132, the gate line 137, the gate electrode 116, and the first compensating layer 175a.

A preliminary gate insulating layer 126' may be formed on the base substrate 120. For example, silicon nitride or silicon oxide may be deposited on the base substrate 120 to form the preliminary gate insulating layer 126'.

A preliminary semiconductor layer 117' may be formed on the preliminary gate insulating layer 126'. For example, an amorphous silicon layer may be deposited on the preliminary gate insulating layer 126', and N+ impurities may be implanted into an upper portion of the amorphous silicon layer to form the preliminary semiconductor layer 117'.

A data metal layer 136' may be formed on the preliminary semiconductor layer 117'.

A first photoresist film 161 may be formed on the data metal layer 136'.

A first mask 162 may be aligned on the first photoresist film 161. The first mask 162 may include a first transparent portion 162a, a first translucent portion 162b, and a first opaque portion 162c.

The first translucent portion 162b may correspond to a region between the source electrode 118 and the drain electrode 119.

The first opaque portion 162c may correspond to the data pad 131, the data line 136, the source electrode 118, the drain electrode 119, and the first compensating layer 175a.

The first transparent portion 162a may correspond to a region between adjacent data lines 136, a region between adjacent first compensating layers 175a, and the remaining portion of the peripheral region 144 other than the data pad 131.

The first photoresist film 161 may be exposed through the first mask 162.

Figure 5:
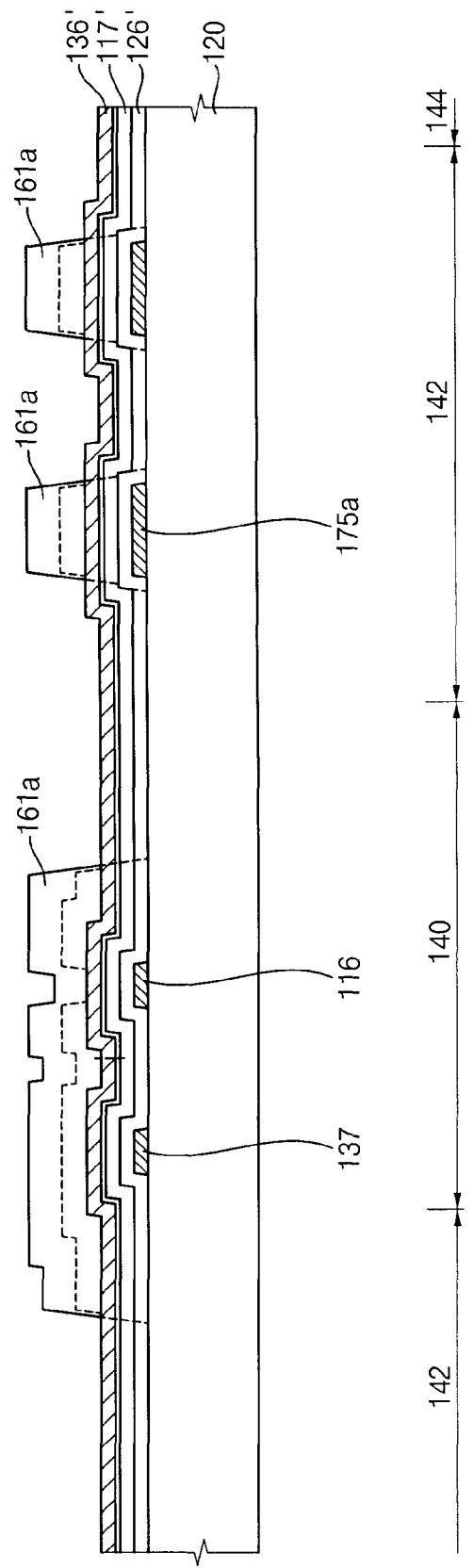

FIG. 5 is a cross-sectional view showing a step forming a first photoresist pattern from the first photoresist film shown in FIG. 4.

Referring to FIG. 5, the exposed first photoresist film 161 may be developed to form the first photoresist pattern 161a.

Figure 6:
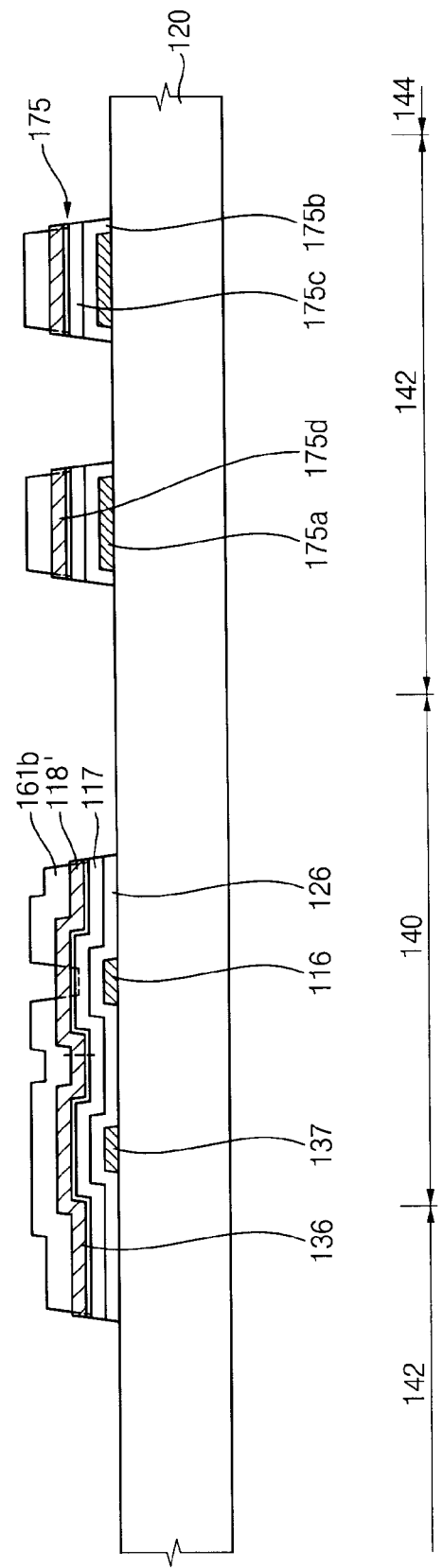

FIG. 6 is a cross-sectional view showing a step of forming a gate insulating layer, a semiconductor layer, a data pad, a data line, a source-drain pattern, a second compensating layer, a third compensating layer, and a fourth compensating layer using the first photoresist pattern shown in FIG. 5.

Referring to FIG. 2, FIG. 5, and FIG. 6, the preliminary gate insulating layer 126', the preliminary semiconductor layer 117', and the data metal layer 136' may be partially etched using the first photoresist pattern 161a as an etching mask to form the gate insulating layer 126, the semiconductor layer 117, the data pad 131, the data line 136, the source-drain pattern 118', the second compensating layer 175b, the third compensating layer 175c, and the fourth compensating layer 175d. Thus, the compensating pattern 175 including the first compensating layer 175a, the second compensating layer 175b, the third compensating layer 175c, and the fourth compensating layer 175d may be formed.

The thickness of the first photoresist pattern 161a may be decreased to form a photoresist pattern 161b that partially exposes a central portion of the source-drain pattern 118'. For example, the thickness of the first photoresist pattern 161a may be decreased through an ashing process or an etch-back process.

The central portion of the source-drain pattern 118' and a portion of the N+ amorphous silicon layer of the semiconductor layer 117 may be etched using the photoresist pattern 161b as an etching mask to form the source electrode 118 and the drain electrode 119. Thus, the thin film transistor TFT including the gate electrode 116, the semiconductor layer 117, the source electrode 118, and the drain electrode 119 may be formed. When the central portion of the source-drain pattern 118' is etched, sides of the data pad 131, the data line 136, the source electrode 118, the drain electrode 119, and the fourth compensating layer 175d may be partially etched.

Figure 7:
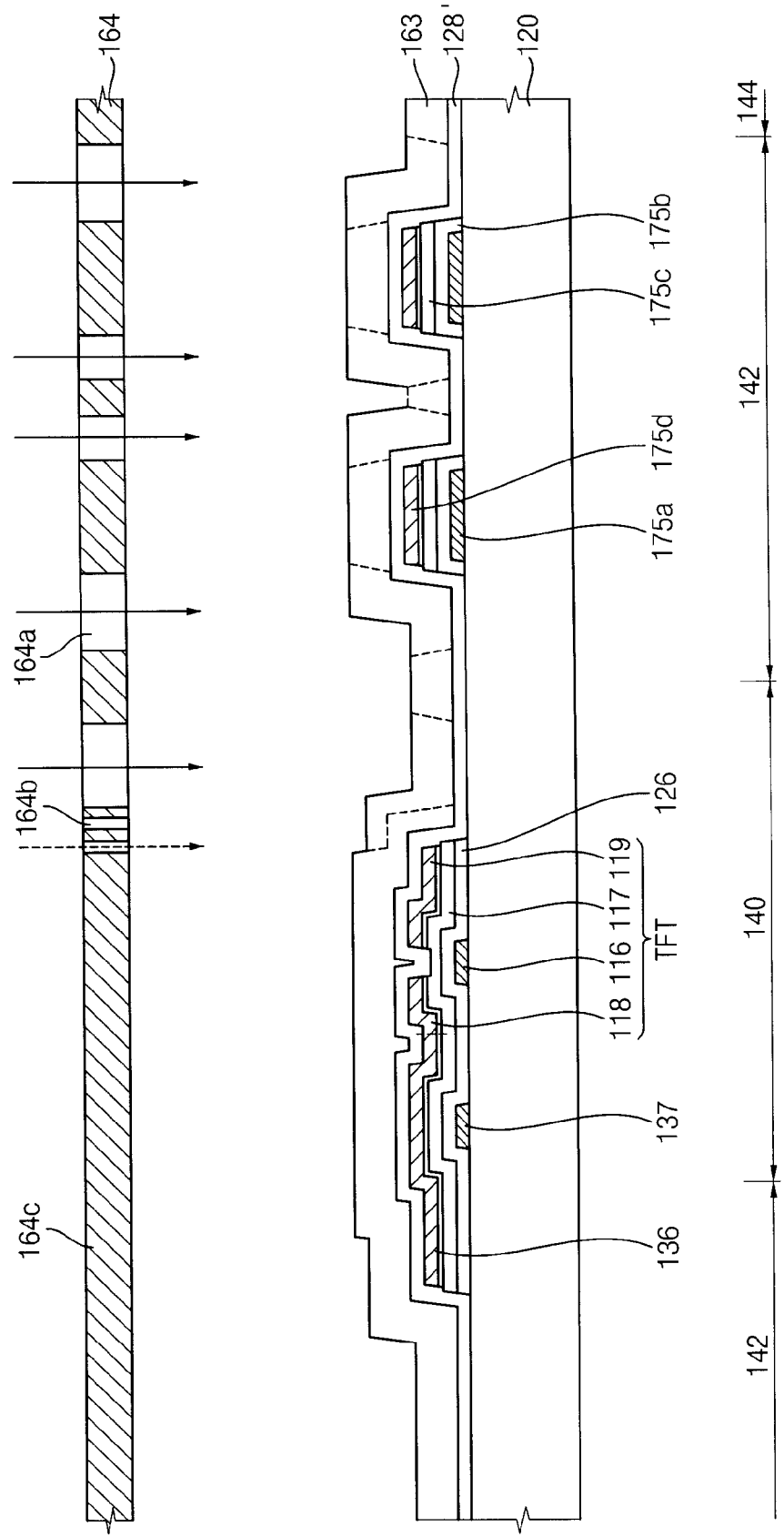

FIG. 7 is a cross-sectional view showing a step of exposing a second photoresist film formed on the substrate shown in FIG. 6.

Referring to FIG. 1, FIG. 2, and FIG. 7, a preliminary passivation layer 128' may be formed on the base substrate 120 to cover the gate pad 132, the gate line 137, the data pad 131, the data line 136, the thin film transistor TFT, and the compensating pattern 175.

The second photoresist film 163 may be formed on the preliminary passivation layer 128'.

A second mask 164 may be aligned on the second photoresist film 163. The second mask 164 may include a second transparent portion 164a, a second translucent portion 164b, and a second opaque portion 164c. The second translucent portion 164b may correspond to a side surface of the drain electrode 119. The second transparent portion 164a corresponds to the data pad 131, the gate pad 132, the pixel electrode 112, and the dummy patterns 176. The second opaque portion 164c may correspond to a space between the data line 136, the gate line 137, the insulating pattern 177, and adjacent dummy patterns 176. Alternatively, the second opaque portion 164c may correspond to a space between the pixel region 140 and the seal region 142.

The second photoresist film 163 may be exposed using the second mask 164.

Figure 8:
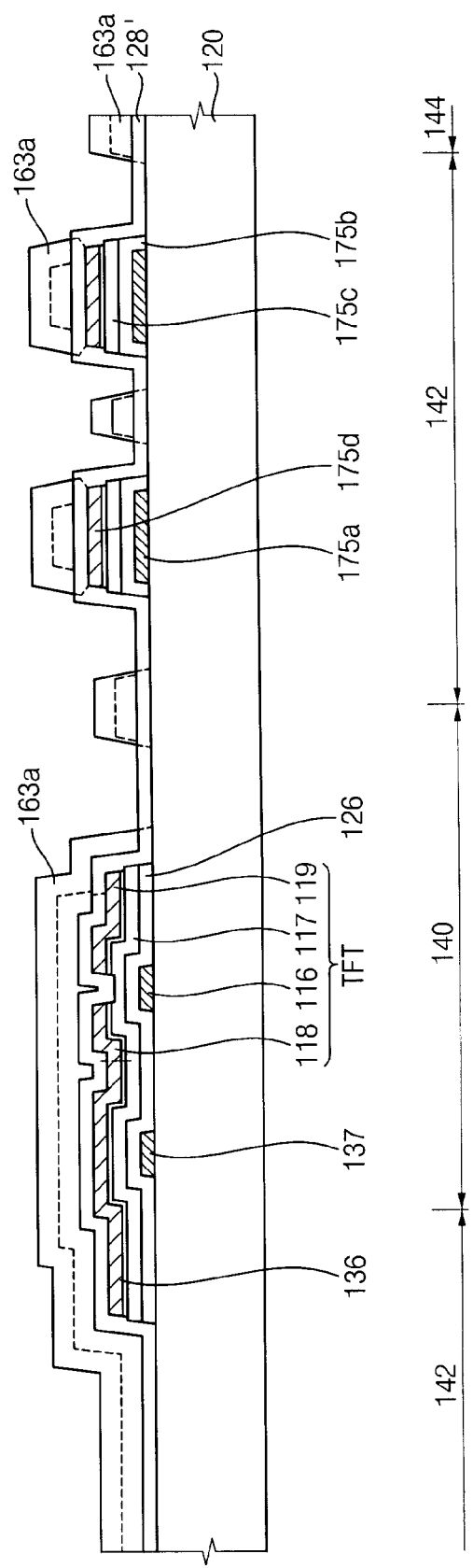

FIG. 8 is a cross-sectional view showing a step of forming a second photoresist pattern from the second photoresist film shown in FIG. 7.

Referring to FIG. 2 and FIG. 8, the exposed second photoresist film 163 may be developed to form the second photoresist pattern 163a.

Figure 9:
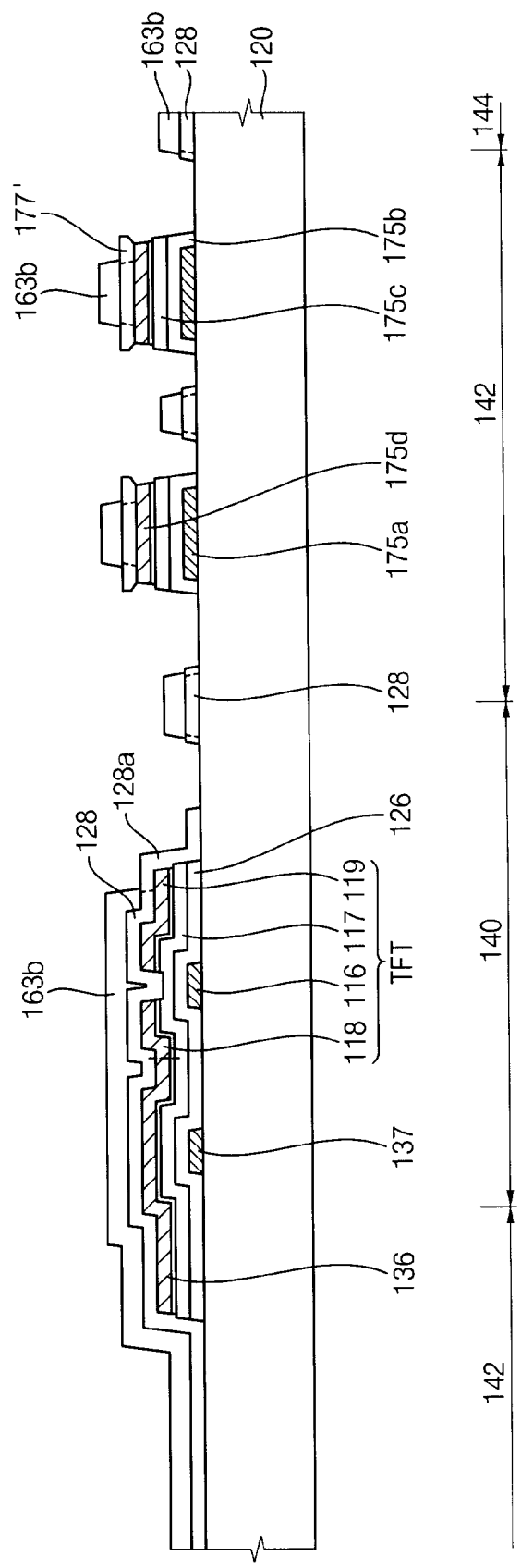

FIG. 9 is a cross-sectional view showing a step of decreasing the thickness of the second photoresist pattern shown in FIG. 8.

Referring to FIG. 2, FIG. 8, and FIG. 9, the preliminary passivation layer 128' may be partially etched using the second photoresist pattern 163a as an etching mask to form a cover pattern 128a that covers side surfaces of the passivation layer 128 and the drain electrode 119.

The thickness of the second photoresist pattern 163a may be decreased to form a photoresist pattern 163b that partially exposes the cover pattern 128a. For example, the thickness of the second photoresist pattern 163a may be decreased through an ashing process or an etch-back process.

Figure 10:
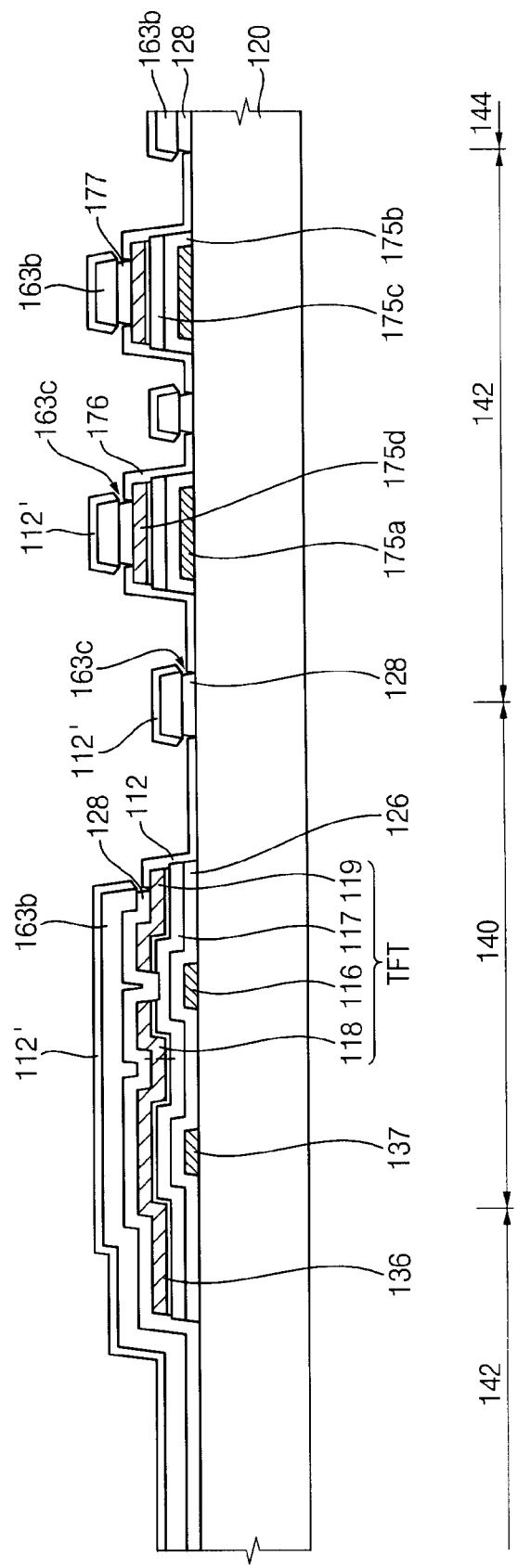

FIG. 10 is a cross-sectional view showing a step of forming a lifting pattern, a pixel electrode, and a dummy pattern on the photoresist pattern shown in FIG. 9.

Referring to FIG. 2 and FIG. 10, the passivation layer 128 may be partially etched using the photoresist pattern 163b as an etching mask to form an undercut 163c under the photoresist pattern 163b. In addition, the cover pattern 128a may be etched to partially expose the side surface of the drain electrode 119.

A lifting pattern 112', the pixel electrode 112, and the dummy pattern 176 may be formed on the photoresist pattern 163b, the base substrate 120 in the display region 140, and the base substrate 120 in the seal region 142, respectively. For example, the transparent conductive layer 112', 112, and 176 may be deposited on the base substrate 120, after the passivation layer 128 is etched using the photoresist pattern 163b, to form the lifting pattern 112', the pixel electrode 112, and the dummy pattern 176.

Figure 11:
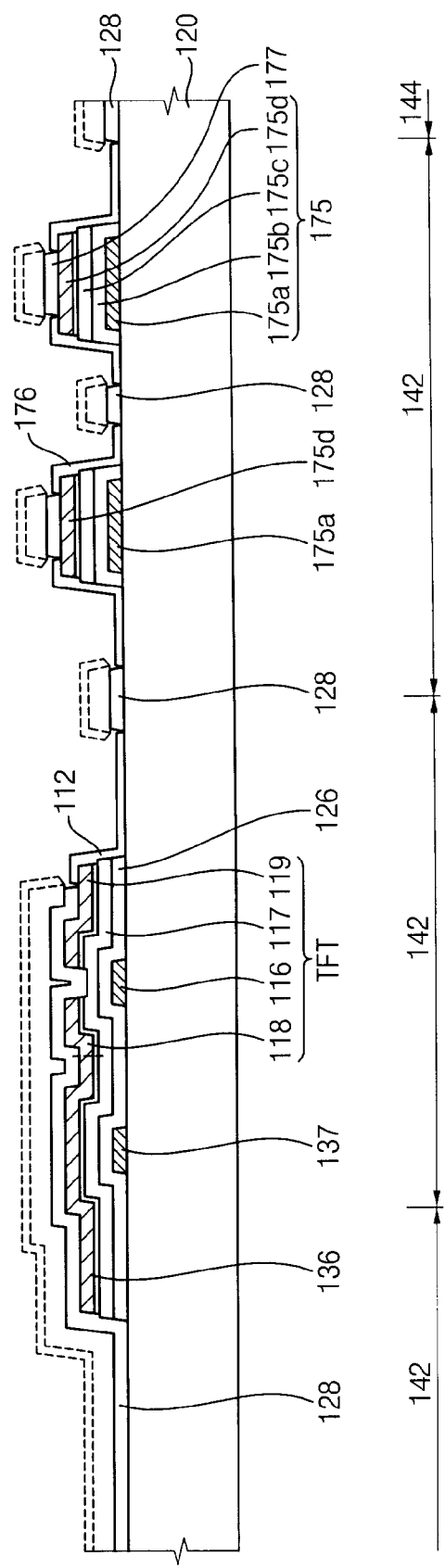

FIG. 11 is a cross-sectional view showing a step of lifting off the lifting pattern shown in FIG. 10.

Referring to FIG. 2, FIG. 10, and FIG. 11, the photoresist pattern 163b may be removed using a developing agent so that the lifting pattern 112' may be lifted off. Thus, the passivation layer 128, the dummy pattern 176, and the insulating pattern 177 may be exposed.

In FIG. 11, the height of the dummy pattern 176 may be adjusted so that the lifting pattern 112' on the insulating pattern 177 may be easily lifted off. For example, the height of the dummy pattern 177 may be about 90 μm.

According to the display substrate shown in FIG. 1, FIG. 2, FIG. 3, FIG. 4, FIG. 5, FIG. 6, FIG. 7, FIG. 8, FIG. 9, FIG. 10, and FIG. 11, the cell-gap compensating part 170 is disposed in the seal region 142, so the thickness of the display substrate in the seal region 142 may be more uniform.

In addition, fewer masks may be needed to manufacture the display substrate, which may decrease the cost of manufacturing the display substrate.

Furthermore, the dummy patterns 176 disposed between the compensating patterns 175 and adjacent to the compensating patterns 175 may be mixed by a juxtaposition mixture, which may adjust the height of the display substrate of the seal region 142.

Figure 12:
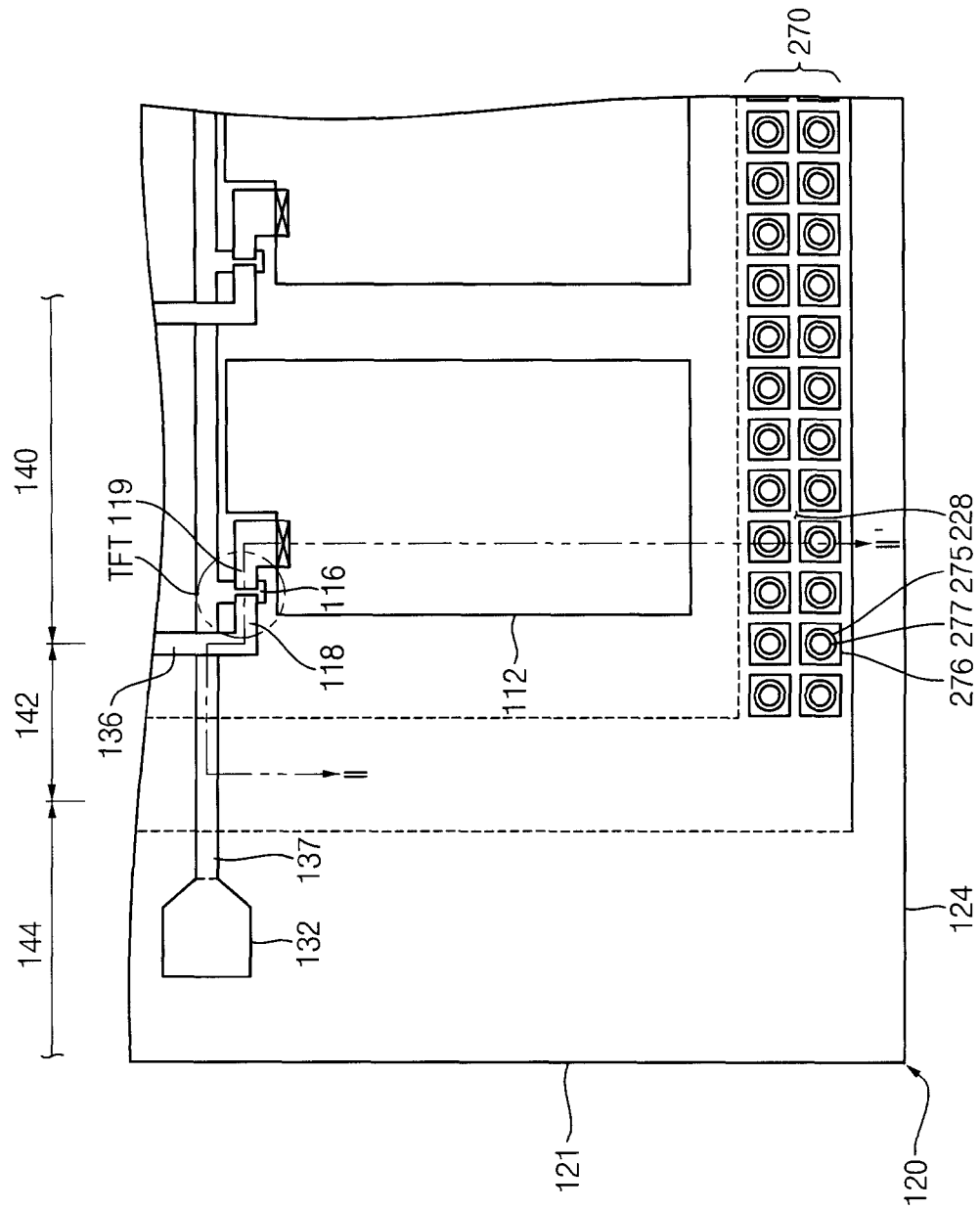
FIG. 12 is a plan view showing a display substrate in accordance with a second exemplary embodiment of the present invention.
Figure 13:
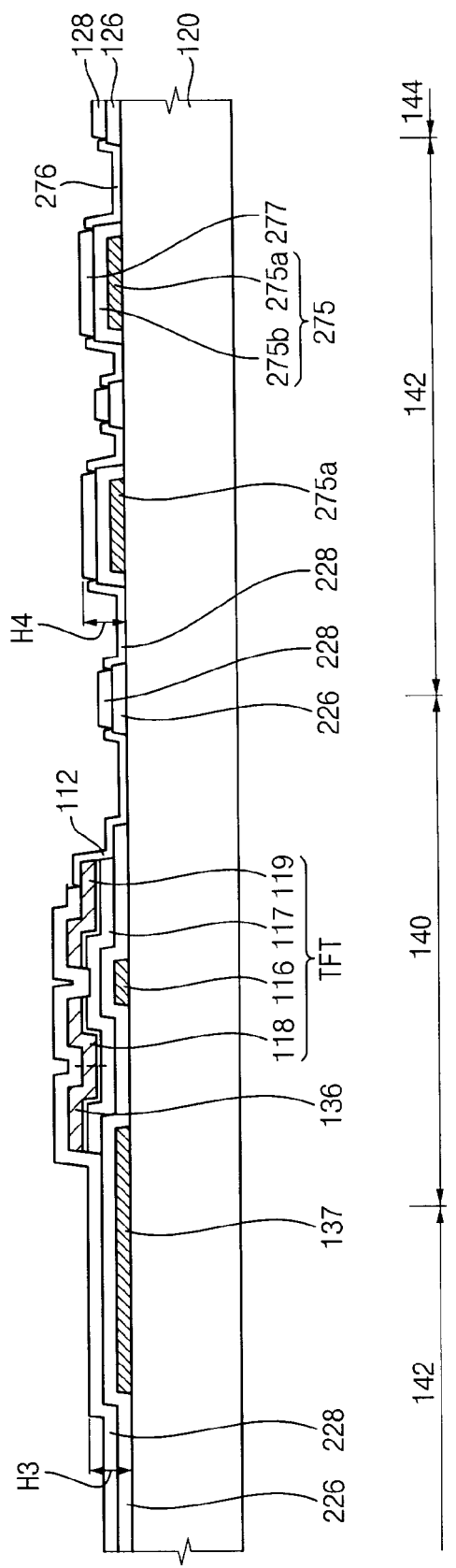
FIG. 13 is a cross-sectional view taken along line II-II' shown in FIG. 12.

FIG. 12 is a plan view showing a display substrate in accordance with a second exemplary embodiment of the present invention. FIG. 13 is a cross-sectional view taken along line II-II' shown in FIG. 12. The display substrate of FIG. 12 and FIG. 13 is substantially the same as in FIG. 1, FIG. 2, and FIG. 3 except for a gate insulating layer, a passivation layer, and a cell-gap compensating part. Thus, the same reference numerals will be used to refer to the same or like parts as those described in FIG. 1, FIG. 2, and FIG. 3 and any further explanation concerning the above elements will be omitted.

Referring to FIG. 12 and FIG. 13, a gate insulating layer 226 may be formed on a base substrate 120 and may cover a gate line 137 and a gate electrode 116.

A passivation layer 228 may be formed on the base substrate 120 and may cover a source electrode 118, a data line 136, and a gate line 137. The passivation layer 228 may have an opening that partially exposes a side surface of the drain electrode 119, so that the exposed side surface of the drain electrode 119 may contact a pixel electrode 112.

In FIG. 12 and FIG. 13, the gate insulating layer 226 and the passivation layer 228 may further have a plurality of openings 228b arranged in a matrix in a seal region 142.

A cell-gap compensating part 270 may be formed in the seal region 142 of the base substrate 120 and may include a compensating pattern 275 and an insulating pattern 277 on the compensating pattern 275.

The compensating pattern 275 may include a first compensating layer 275a and a second compensating layer 275b.

The first compensating layer 275a may be formed on the base substrate 120 and may be formed from the same layer as the gate electrode 116, the gate line 137, and the gate pad 132. In FIG. 12 and FIG. 13, the first compensating layer 275a is a conductive pattern.

The second compensating layer 275b may be formed on the first compensating layer 275a, and may be formed from the same layer as the gate insulating layer 226. In FIG. 12 and FIG. 13, the second compensating layer 275b covers an upper surface and a side surface of the first compensating layer 275a. Alternatively, the second compensating layer 275b may expose the side surface of the first compensating layer 275a.

The insulating pattern 277 may be formed on the second compensating layer 275b and may be formed from the same layer as the passivation layer 228.

The cell-gap compensating part 270 may include a dummy pattern 276. The dummy pattern 276 may be formed in each opening 128b of the passivation layer 228, which may be formed in the seal region 142.

In FIG. 12 and FIG. 13, the height H4 of the cell-gap compensating part 270 may be substantially the same as the height H3 of the display substrate in the seal region 142 adjacent to the first side 121. The height of the display substrate may be determined with respect to an upper surface of the base substrate 120. For example, the height H4 of the cell-gap compensating part 270 may be substantially the same as the height of the display substrate in the seal region 142 adjacent to the fourth side 124. Further, the height H4 of the cell-gap compensating part 270 and the height H3 of the display substrate in the seal region 142 adjacent to the first side 121 may be about 8,500 Å.

Figure 14:
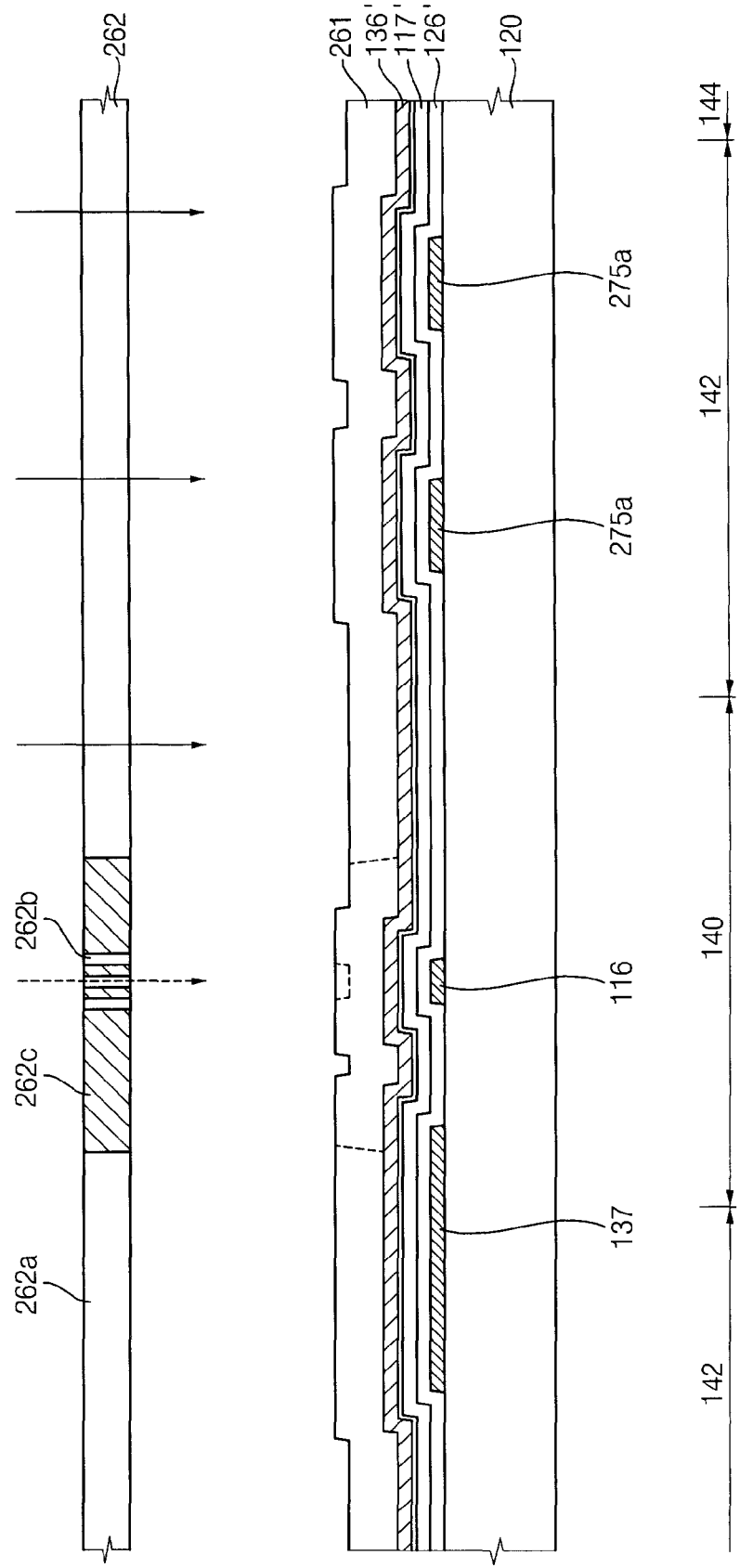
FIG. 14, FIG. 15, FIG. 16, FIG. 17, FIG. 18, FIG. 19, and FIG. 20 are cross-sectional views showing a method of manufacturing the display substrate shown in FIG. 12.

FIG. 14, FIG. 15, FIG. 16, FIG. 17, FIG. 18, FIG. 19, and FIG. 20 are cross-sectional views showing a method of manufacturing the display substrate shown in FIG. 12. FIG. 14 is a cross-sectional view showing a step of exposing a photoresist film for manufacturing the display substrate shown in FIG. 12.

Referring to FIG. 12 and FIG. 14, the gate pad 132, the gate line 137, the gate electrode 116, and the first compensating layer 275a may be formed on the base substrate 120.

A preliminary gate insulating layer 126', a preliminary semiconductor layer 117', a data metal layer 136', and a first photoresist film 261 may be formed on the base substrate 120, in sequence.

A first mask 262 may be aligned on the first photoresist film 261. The first mask 262 includes a first transparent portion 262a, a first translucent portion 262b, and a first opaque portion 262c.

The first transparent portion 262a may correspond to a region between adjacent data lines 136, the seal region 142 except for the data line 136, and the peripheral region 144 except for the data pad 131.

The first translucent portion 262b may correspond to a region between the source electrode 118 and the drain electrode 119.

The first opaque portion 262c may correspond to the data pad 131, the data line 136, the source electrode 118, and the drain electrode 119.

The first photoresist film 261 may be exposed through the first mask 262.

Figure 15:
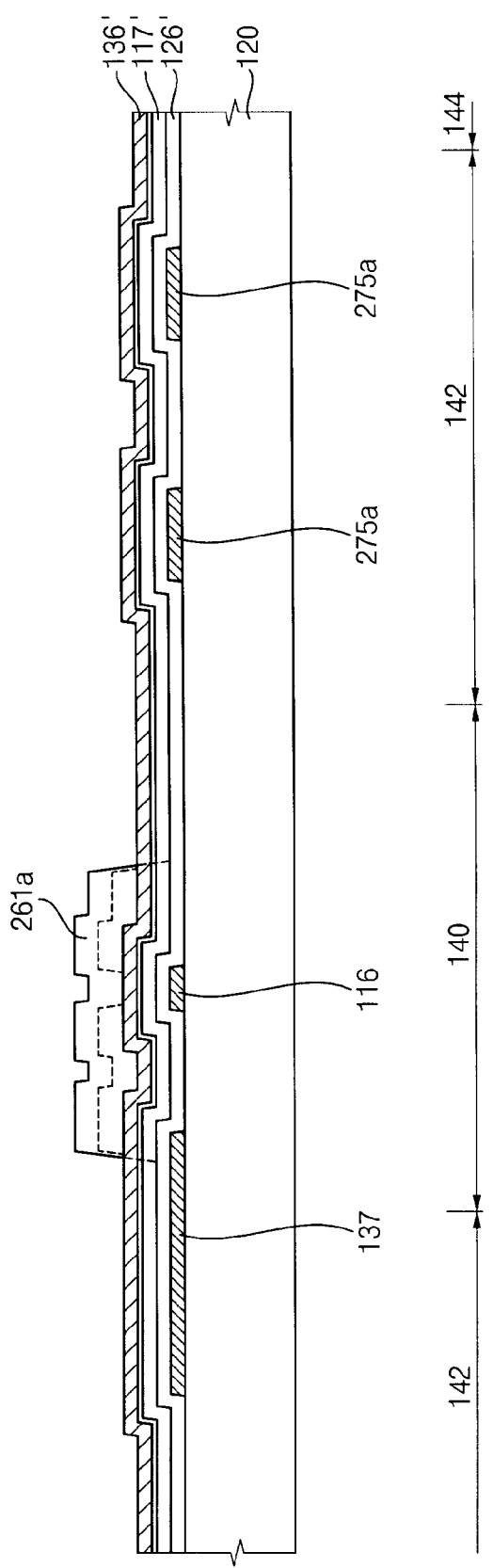

FIG. 15 is a cross-sectional view showing a step of forming a first photoresist pattern from the first photoresist film shown in FIG. 14.

Referring to FIG. 15, the exposed first photoresist film 261 may be developed to form the first photoresist pattern 261a.

Figure 16:
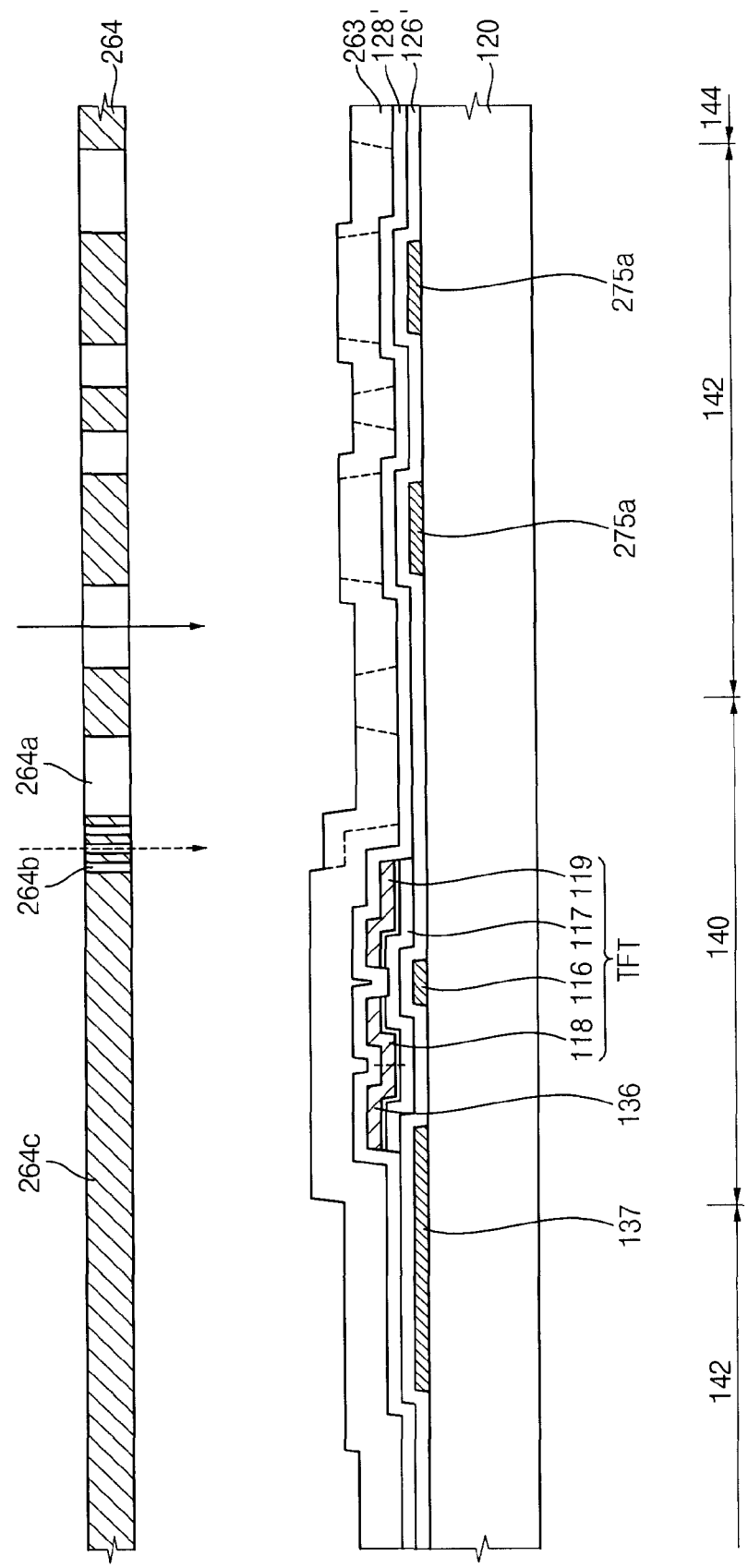

FIG. 16 is a cross-sectional view showing a step of exposing a second photoresist film formed on the substrate shown in FIG. 15.

Referring to FIG. 1, FIG. 12, and FIG. 16, the preliminary semiconductor layer 117' and the data metal layer 136' may be partially etched to form the semiconductor layer 117, the data pad 131, the data line 136, the source electrode 118, and the drain electrode 119 through an etching process using the first photoresist pattern 261a, an ashing process to decrease a thickness of the first photoresist pattern 261a, and an etching process using the first photoresist pattern 261a having the decreased thickness. The semiconductor layer 117 may be formed on the preliminary gate insulating layer 126'.

Thus, the thin film transistor TFT including the gate electrode 116, the semiconductor layer 117, the source electrode 118, and the drain electrode 119 may be formed.

A preliminary passivation layer 128' and a second photoresist film 263 may be formed on the preliminary gate insulating layer 126' to cover the data pad 131, the data line 136, and the thin film transistor TFT.

A second mask 264 may be aligned on the second photoresist film 263. The second mask 264 may include a second transparent portion 264a, a second translucent portion 264b, and a second opaque portion 264c. The second translucent portion 264b corresponds to a side surface of the drain electrode 119. The second transparent portion 264a corresponds to the data pad 131, the gate pad 132, the pixel electrode 112, and the dummy pattern 276. The second opaque portion 264c corresponds to a space between the data line 136, the gate line 137, the first compensating layer 275a, and adjacent dummy patterns 276.

The second photoresist film 263 may be exposed using the second mask 264.

Figure 17:
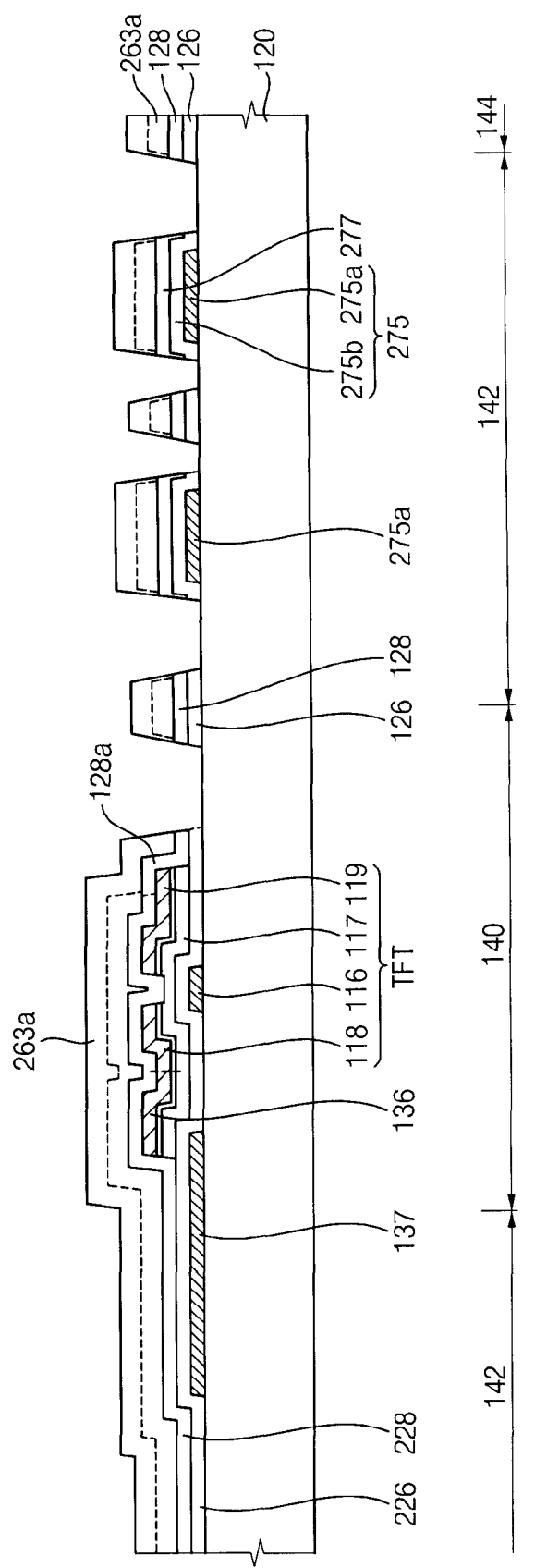

FIG. 17 is a cross-sectional view showing a step of forming a passivation layer, a cover pattern and a gate insulating layer on the substrate shown in FIG. 16.

Referring to FIG. 12, FIG. 16, and FIG. 17, the exposed second photoresist film 263 may be developed to form the second photoresist pattern 263a.

The preliminary passivation layer 128' and the preliminary gate insulating layer 126' may be partially etched using the second photoresist pattern 263a as an etching mask to form the passivation layer 228, a cover pattern 128a, and the gate insulating layer 226. The cover pattern 128a may cover a side surface of the drain electrode 119.

Figure 18:
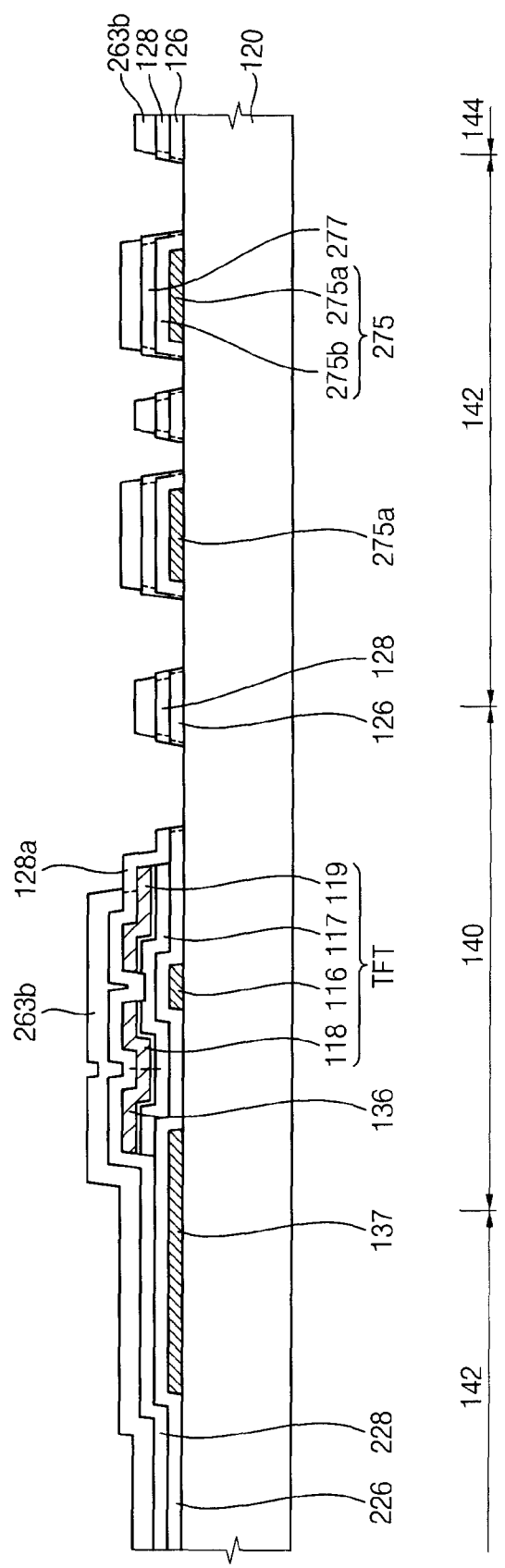

FIG. 18 is a cross-sectional view showing a step of decreasing a thickness of the second photoresist pattern shown in FIG. 17.

Referring to FIG. 12 and FIG. 18, the thickness of the second photoresist pattern 263a being decreased to form a photoresist pattern 263b that partially exposes the cover pattern 128a.

Figure 19:
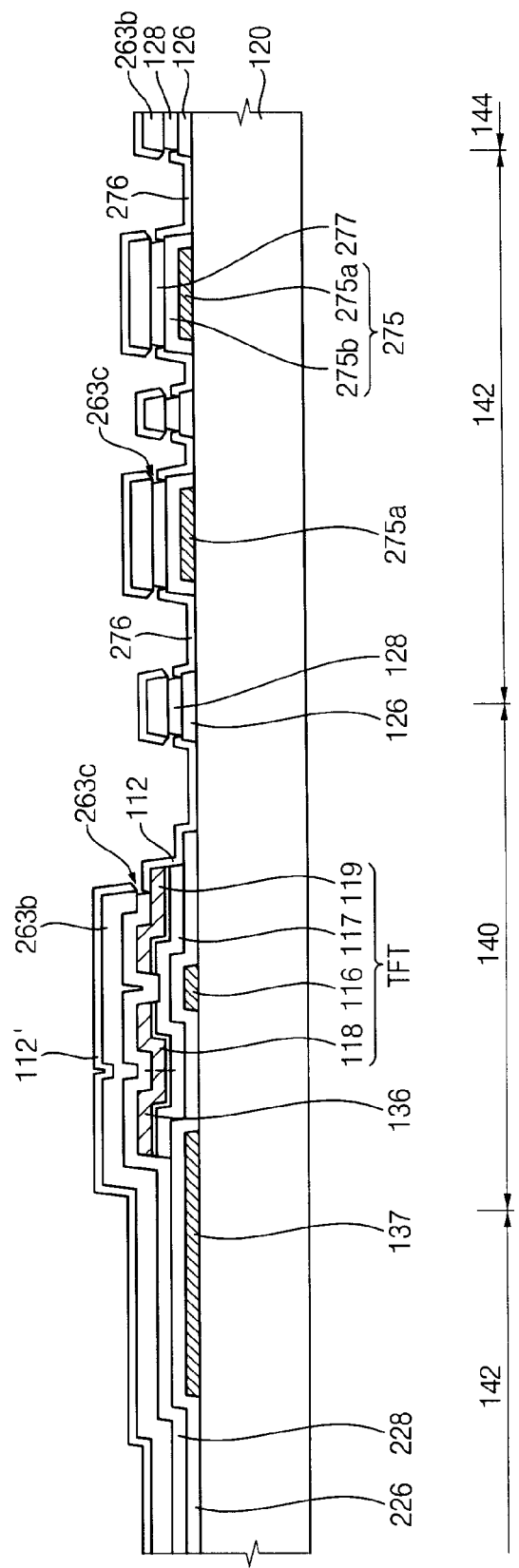

FIG. 19 is a cross-sectional view showing a step of forming a lifting pattern, a pixel electrode, and a dummy pattern on the substrate shown in FIG. 18.

Referring to FIG. 12 and FIG. 19, the passivation layer 128 may be partially etched again using the photoresist pattern 263b as an etching mask to form an undercut 263c under the photoresist pattern 263b. In addition, the cover pattern 128a may be etched to partially expose the side surface of the drain electrode 119.

A lifting pattern 112', the pixel electrode 112, and the dummy pattern 276 may be formed on the photoresist pattern 263b, the base substrate 120 in the display region 140, and the base substrate 120 in the seal region 142, respectively.

Figure 20:
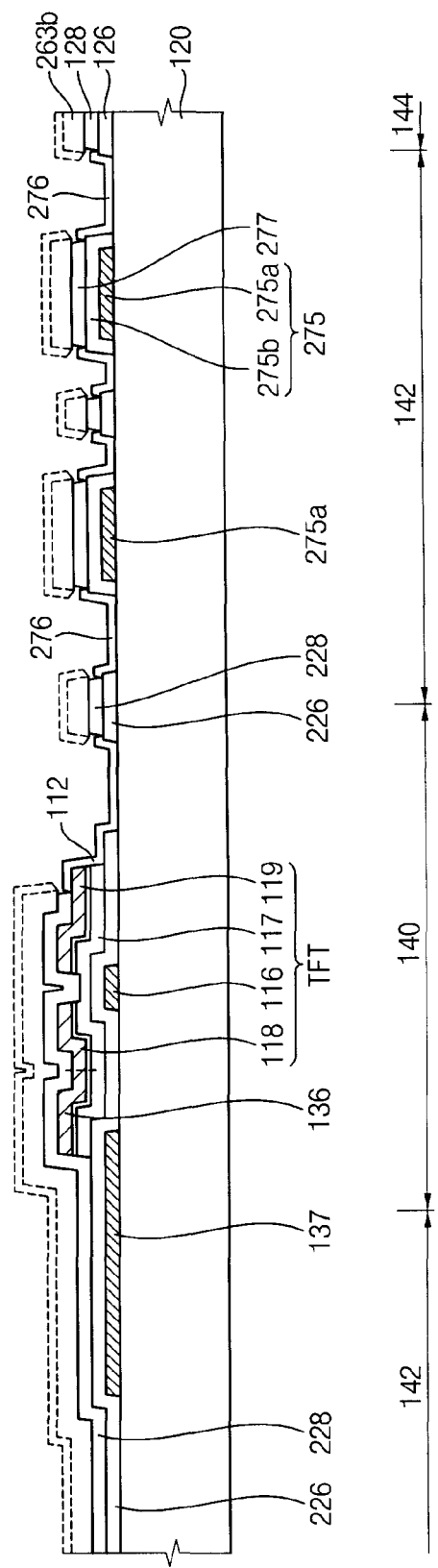

FIG. 20 is a cross-sectional view showing a step of lifting off the lifting pattern shown in FIG. 19.

Referring to FIG. 12, FIG. 19, and FIG. 20, the photoresist pattern 263b may be removed using a developing agent so that the lifting pattern 112' may be lifted off.

According to the display substrate shown in FIG. 12 to FIG. 20, the cell-gap compensating part may have substantially the same height as the display substrate in the seal region 142 adjacent to the gate pad 132, so the thickness of the display substrate in the seal region 142 may be more uniform.

Figure 21:
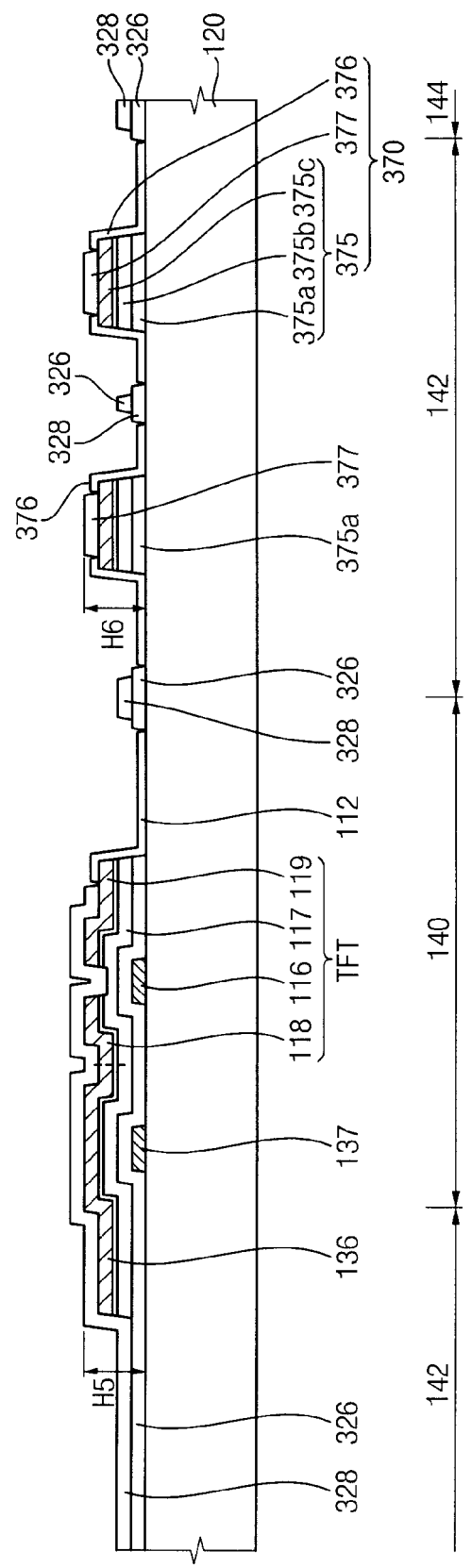
FIG. 21 is a cross-sectional view showing a display substrate in accordance with a third exemplary embodiment of the present invention.

FIG. 21 is a cross-sectional view showing a display substrate in accordance with a third exemplary embodiment of the present invention. The display substrate of FIG. 21 may be substantially the same as in FIG. 1 and FIG. 2 except for a mold frame. Thus, the same reference numerals will be used to refer to the same or like parts as those described in FIG. 1 and FIG. 2 and any further explanation concerning the above elements will be omitted.

Referring to FIG. 2 and FIG. 21, a gate insulating layer 326 may be formed on a base substrate 120 and may cover a gate line 137 and a gate electrode 116.

A passivation layer 328 may be formed on the gate insulating layer 326, and may cover a source electrode 118, a data line 136, and the gate line 137.

A cell-gap compensating part 370 may be formed in the seal region 142 of the base substrate 120 and may include a compensating part 375, an insulating pattern 377 on the compensating pattern 375, and a dummy pattern 376 surrounding the compensating pattern 375.

The compensating pattern 375 may include a first compensating layer 375a, a second compensating layer 375b, and a third compensating layer 375c.

The first compensating layer 375a may be formed on the base substrate 120 and may be formed from the same layer as the gate insulating layer 326.

The second compensating layer 375b may be formed on the first compensating layer 375a and may be formed from the same layer as the semiconductor layer 117. In FIG. 21, the second compensating layer 375b does not cover the first compensating layer 375a.

The third compensating layer 375c may be formed on the second compensating layer 375b and may be formed from the same layer as a data pad 131 (shown in FIG. 1), the data line 136, the source electrode 118, and a drain electrode 119. In FIG. 21, the third compensating layer 375c includes a conductive pattern.

The insulating pattern 377 may be formed on the third compensating layer 375c and may be formed from the same layer as the passivation layer 328.

The dummy pattern 376 may surround the compensating pattern 375 and the insulating pattern 377 and may be formed from the same layer as a pixel electrode 112.

In FIG. 2 and FIG. 21, the height H6 of the cell-gap compensating part 370 may be substantially the same as the height H5 of the display substrate in the seal region 142 in which the data line 136 is formed. For example, the height H6 of the cell-gap compensating part 370 and the height H5 of the display substrate in the seal region 142 in which the data line 136 is formed may be about 10,800 Å.

FIG. 22 is a plan view showing a display substrate in accordance with a fourth exemplary embodiment of the present invention. The display substrate of FIG. 22 may be substantially the same as in FIG. 1, FIG. 2, and FIG. 3 except for a cell-gap compensating part. Thus, the same reference numerals will be used to refer to the same or like parts as those described in FIG. 1, FIG. 2, and FIG. 3 and any further explanation concerning the above elements will be omitted.

Referring to FIG. 22, the cell-gap compensating part 470 may include a compensating pattern 475, an insulating pattern 477, and a dummy pattern 476.

The dummy pattern 476 may be arranged in a matrix in a seal region 142.

A plurality of compensating patterns 475 may be arranged in each dummy pattern 476. In FIG. 22, six compensating patterns 475 may be formed in each dummy pattern 476. Alternatively, the number of the compensating patterns 475 in each dummy pattern 476 may be changed.

The insulating pattern 477 may be formed in each compensating pattern 475.

According to the display substrate shown in FIG. 22, the plurality of the compensating patterns 475 may be formed in each dummy pattern 476. Thus, the cell-gap compensating part 470 may securely support a seal spacer (not shown) that may be disposed on the cell-gap compensating part 470, although the size of the seal spacer may be decreased.

FIG. 23 is a cross-sectional view showing a liquid crystal display (LCD) device in accordance with a fifth exemplary embodiment of the present invention.

Referring to FIG. 23, the LCD device includes a display substrate 180, an opposite substrate 110, a liquid crystal layer 150, and a sealing member 155.

The display substrate 180 of FIG. 23 is substantially the same as in FIG. 1, FIG. 2, and FIG. 3 except for a cell-gap compensating part. Thus, the same reference numerals will be used to refer to the same or like parts as those described in FIG. 1, FIG. 2, and FIG. 3 and any further explanation concerning the above elements will be omitted. Alternatively, the display substrate 180 of FIG. 23 may be substantially the same as in FIG. 12 and FIG. 13 or FIG. 21.

The opposite substrate 110 may include an opposite base substrate 101, a black matrix 102, a color filter 104, and a common electrode 106.

The opposite base substrate 101 may be spaced apart from a base substrate 120 of the display substrate 180 by a constant distance.

The black matrix 102 may be formed on the opposite base substrate 101 to block light that passes through a region in which liquid crystals may be difficult to control.

The color filter 104 may be formed on the opposite base substrate 101 and may face a pixel electrode 112 of the display substrate 180.

The common electrode 106 may be formed on the opposite base substrate 101 and may cover the black matrix 102 and the color filter 104.

The liquid crystal layer 150 may be interposed between a display region 140 of the display substrate 180 and the opposite substrate 110. The arrangement of the liquid crystals of the liquid crystal layer 150 may vary in response to an electric field applied between the pixel electrode 112 and the common electrode 106 and thus, the light transmittance of the liquid crystal layer 150 may be changed.

The sealing member 155 may be interposed between the seal region 142 of the display substrate 180 and the opposite substrate 110 and may include a sealant 152 and a seal spacer 154.

The sealant 152 may seal the liquid crystal layer 150. The sealant 152 may include a light curable resin or a thermosetting resin. These materials may be used alone or in a combination thereof.

The seal spacer 154 may be disposed in the sealant 152 and may maintain a cell-gap, which is defined as a distance between the display substrate 180 and the opposite substrate 110 in the seal region 142. For example, the seal spacer 154 may include a plastic bead or a glass bead.

In FIG. 23, a spacer 154 adjacent to a pad part 130 (shown in FIG. 1) of the display substrate 180 is supported by a portion of a passivation layer 128 formed on a data line 136 or a gate line 137, and a spacer 154 opposite the pad part 130 is supported by an insulating pattern 177 of a cell-gap compensating part. Alternatively, one seal spacer 154 may be disposed on a plurality of insulating patterns 177.

According to the LCD device shown in FIG. 23, the thickness of the display substrate 180 in the seal region 142 may be more uniform, so that the cell-gap between the display substrate 180 and the opposite substrate 110 may also be more uniform.

According to exemplary embodiments of the present invention, a cell-gap compensating part may be formed in a seal region, so that the thickness of a display substrate in the seal region may be more uniform.

In addition, fewer masks may be needed to manufacture the display substrate, so the cost of manufacturing the display substrate may be decreased.

Furthermore, compensating patterns and the dummy patterns may be mixed by a juxtaposition mixture, which may adjust the height of the display substrate in the seal region.

Therefore, the uniformity of the cell-gap between the display substrate and the opposite substrate may be increased, which may improve the image display quality.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display substrate, comprising:
   a base substrate comprising a display region, a seal region surrounding the display region, and a peripheral region surrounding the seal region;
   a thin-film transistor in the display region;
   a pixel electrode connected to a drain electrode of the thin film transistor, the pixel electrode contacting the base substrate;
   a pad part interposed between a first side of the base substrate and the seal region, the pad part being connected to the thin film transistor through a first transmission line; and
   a cell-gap compensating part in the seal region, the cell-gap compensating part comprising a compensating pattern adjacent to a second side of the base substrate and an insulating pattern on the compensating pattern,
   wherein the cell-gap compensating part further comprises a dummy pattern to surround the compensating pattern and to expose the insulating pattern,
   wherein the dummy pattern is formed from a same layer as the pixel electrode.

2. The display substrate of claim 1, wherein the compensating pattern comprises a conductive pattern formed from a same layer as the pad part.

3. The display substrate of claim 2, further comprising:
   a data pad on a gate insulating layer that covers the gate electrode, the gate line, and the gate pad, the data pad being connected to a source electrode of the thin film transistor through a second transmission line,
   wherein the pad part comprises a gate pad on the base substrate, the gate pad being connected to a gate electrode of the thin film transistor through the first transmission line.

4. The display substrate of claim 3, wherein the compensating pattern comprises:
   a first compensating layer on the base substrate, the first compensating layer being formed from a same layer as the gate pad; and
   a second compensating layer on the first compensating layer, the second compensating layer being formed from a same layer as a gate insulating layer.

5. The display substrate of claim 4, wherein the second compensating layer covers the first compensating layer.

6. The display substrate of claim 4, wherein the compensating pattern further comprises:
   a third compensating layer on the second compensating layer, the third compensating layer being formed from a same layer as a semiconductor layer of the thin film transistor; and
   a fourth compensating layer on the third compensating layer, the fourth compensating layer being formed from a same layer as the data pad.

7. The display substrate of claim 3, wherein the compensating pattern comprises:
   a first compensating layer on the base substrate, the first compensating layer being formed from a same layer as a gate insulating layer;
   a second compensating layer on the first compensating layer, the second compensating layer being formed from a same layer as a semiconductor layer of the thin film transistor; and
   a third compensating layer on the second compensating layer, the third compensating layer being formed from a same layer as the data pad.

8. The display substrate of claim 1, wherein the insulating pattern is formed from a same layer as a passivation layer that covers the thin film transistor.

9. The display substrate of claim 8, wherein the insulating pattern is smaller than the compensating pattern in plan view.

10. The display substrate of claim 1, wherein one compensating pattern is disposed in the dummy pattern.

11. The display substrate of claim 1, wherein a plurality of compensating patterns is disposed in the dummy pattern.

12. The display substrate of claim 1, wherein the second side faces the first side.

13. The display substrate of claim 1, wherein the second side is substantially perpendicular to the first side.

14. A display substrate, comprising:
   a base substrate comprising a display region, a seal region surrounding the display region, and a peripheral region surrounding the seal region;
   a thin-film transistor in the display region;
   a pixel electrode connected to a drain electrode of the thin film transistor, the pixel electrode contacting the base substrate;
   a pad part interposed between a first side of the base substrate and the seal region, the pad part being connected to the thin film transistor through a first transmission line; and
   a cell-gap compensating part in the seal region, the cell-gap compensating part comprising a compensating pattern adjacent to a second side of the base substrate and an insulating pattern on the compensating pattern,
   wherein the cell-gap compensating part further comprises a dummy pattern to surround the compensating pattern and to expose the insulating pattern,
   wherein the cell-gap compensating part further comprises a plurality of dummy patterns arranged in a matrix in the seal region.

15. A liquid crystal display device, comprising:
   a display substrate comprising:
      a base substrate comprising a display region, a seal region surrounding the display region, and a peripheral region surrounding the seal region;
      a thin film transistor in the display region;
      a pixel electrode connected to a drain electrode of the thin film transistor, the pixel electrode contacting the base substrate;
      a pad part interposed between a first side of the base substrate and the seal region, the pad part being connected to the thin film transistor through a transmission line; and
      a cell-gap compensating part in the seal region, the cell-gap compensating part comprising a compensating pattern adjacent to a second side of the base substrate and an insulating pattern on the compensating pattern;
   an opposite substrate facing the display substrate;
   a liquid crystal layer interposed between the display region of the display substrate and the opposite substrate; and
   a sealing member interposed between the seal region of the display substrate and the opposite substrate, the sealing member comprising:
      a sealant to seal the liquid crystal layer; and
      a seal spacer in the sealant to maintain a distance between the display substrate and the opposite substrate, wherein the cell-gap compensating part comprises a dummy pattern to surround the compensating pattern and to expose the insulating pattern, wherein the dummy pattern is formed from a same layer as the pixel electrode.

16. The liquid crystal display device of claim 15, the sealing member further comprises a plurality of seal spacers, and a portion of the seal spacers adjacent to the first side is supported by a passivation layer covering the transmission line and the thin film transistor.

17. The liquid crystal display device of claim 16, wherein a portion of the seal spacers adjacent to the second side is supported by the insulating pattern.

* * * * *